(12) United States Patent  
Saito et al.

(10) Patent No.: US 9,064,791 B2
(45) Date of Patent: *Jun. 23, 2015

(54) METHOD FOR PRODUCING P-TYPE ZNO BASED COMPOUND SEMICONDUCTOR LAYER, METHOD FOR PRODUCING ZNO BASED COMPOUND SEMICONDUCTOR ELEMENT, AND AN N-TYPE ZNO BASED COMPOUND SEMICONDUCTOR LAMINATE STRUCTURE

(71) Applicant: Stanley Electric Co., Ltd., Tokyo (JP)

(72) Inventors: Chizu Saito, Yokohama (JP); Hiroyuki Kato, Yokohama (JP); Michihiro Sano, Odawara (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/197,900

(22) Filed: Mar. 5, 2014

(65) Prior Publication Data

US 2014/0183531 A1 Jul. 3, 2014

Related U.S. Application Data

(62) Division of application No. 13/948,771, filed on Jul. 23, 2013.

(30) Foreign Application Priority Data

| Jul. 27, 2012 | (JP) | 2012-166833 |
| Jul. 27, 2012 | (JP) | 2012-166834 |
| Jul. 27, 2012 | (JP) | 2012-166835 |
| Jul. 27, 2012 | (JP) | 2012-166836 |
| Jul. 27, 2012 | (JP) | 2012-166837 |
| Feb. 12, 2013 | (JP) | 2013-024013 |
| Feb. 27, 2013 | (JP) | 2013-036824 |

(51) Int. Cl.
*H01L 21/00* (2006.01)
*H01L 21/16* (2006.01)
(Continued)

(52) U.S. Cl.
CPC .......... *H01L 29/22* (2013.01); *H01L 21/02554* (2013.01); *H01L 21/02565* (2013.01);
(Continued)

(58) Field of Classification Search
CPC .................. H01L 21/02554; H01L 21/02565; H01L 21/02579; H01L 21/02631; H01L 21/02664; H01L 29/12; H01L 29/22; H01L 21/02576

See application file for complete search history.

(56) References Cited

U.S. PATENT DOCUMENTS

| 6,342,313 B1 | 1/2002 | White et al. |
| 6,896,731 B1 | 5/2005 | Yamamoto et al. |

(Continued)

FOREIGN PATENT DOCUMENTS

| JP | 2001-048698 A | 2/2001 |
| JP | 2001-068707 A | 3/2001 |

(Continued)

OTHER PUBLICATIONS

Andreas et al (Transparent Conducting Oxides—An Up-To-Date Overview, Published: Apr. 19, 2012).*

(Continued)

*Primary Examiner* — Khaja Ahmad
(74) *Attorney, Agent, or Firm* — Holtz, Holtz, Goodman & Chick PC

(57) ABSTRACT

A method for producing a p-type ZnO based compound semiconductor layer including the steps of (a) supplying (i) Zn, (ii) O, (iii) optional Mg, and (iv) a Group 11 element which is Cu and/or Ag to form a $Mg_xZn_{1-x}O$ ($0 \leq x \leq 0.6$) single crystal film doped with the Group 11 element; (b) supplying at least one Group 13 element selected from the group consisting of B, Ga, Al, and In on the $Mg_xZn_{1-x}O$ ($0 \leq x \leq 0.6$) single crystal film; (c) alternately carrying out the steps (a) and (b) to form a laminate structure; and (d) annealing the laminate structure to form a p-type $Mg_xZn_{1-x}O$ ($0 \leq x \leq 0.6$) layer co-doped with the Group 11 element and the Group 13 element.

6 Claims, 25 Drawing Sheets

(51) Int. Cl.
*H01L 29/22* (2006.01)
*H01L 21/02* (2006.01)
*H01L 29/12* (2006.01)

(52) U.S. Cl.
CPC .......... *H01L21/02579* (2013.01); *H01L 29/12* (2013.01); *H01L 21/02576* (2013.01); *H01L 21/02631* (2013.01); *H01L 21/02664* (2013.01)

(56) References Cited

U.S. PATENT DOCUMENTS

| | | | |
|---|---|---|---|
| 6,987,029 B2 | 1/2006 | Niki et al. | |
| 7,132,691 B1 | 11/2006 | Tanabe et al. | |
| 7,723,154 B1* | 5/2010 | Adekore et al. | 438/104 |
| 2002/0025621 A1* | 2/2002 | Iwata et al. | 438/220 |
| 2002/0034861 A1* | 3/2002 | Iwata et al. | 438/483 |
| 2005/0017261 A1 | 1/2005 | Ishizaki | |
| 2007/0034144 A1* | 2/2007 | Ogawa et al. | 117/95 |
| 2009/0203166 A1* | 8/2009 | Kennedy et al. | 438/104 |
| 2011/0059563 A1* | 3/2011 | Okada et al. | 438/46 |
| 2011/0089418 A1 | 4/2011 | Yamamuro et al. | |
| 2014/0084288 A1 | 3/2014 | Saito et al. | |

FOREIGN PATENT DOCUMENTS

| | | |
|---|---|---|
| JP | 2004-221132 A | 8/2004 |
| JP | 2009-256142 A | 11/2009 |
| JP | 4365530 B2 | 11/2009 |
| JP | 2011-091077 A | 5/2011 |
| JP | 2011-096902 A | 5/2011 |
| JP | 2013-211513 A | 10/2013 |

OTHER PUBLICATIONS

Extended European Search Report dated Aug. 8, 2014 in counterpart European Application No. 13020062.9.
U.S. Appl. No. 14/034,038, filed Sep. 23, 2013, First Named Inventor: Chizu Saito, Title: "ZnO Based Compound Semiconductor Element, and Method for Producing the Same".
Extended European Search Report dated Aug. 28, 2014 issued in counterpart European Application No. 14020016.3.
Shet, et al., "Carrier concentration tuning of bandgap-reduced p-type ZnO films by codoping of Cu and Ga for improving photoelectrochemical response", Journal of Applied Physics, American Institute of Physics, vol. 103, No. 7, Apr. 1, 2008, pp. 73504-1-73504-5.

* cited by examiner

FIG.16A
FIG.16B
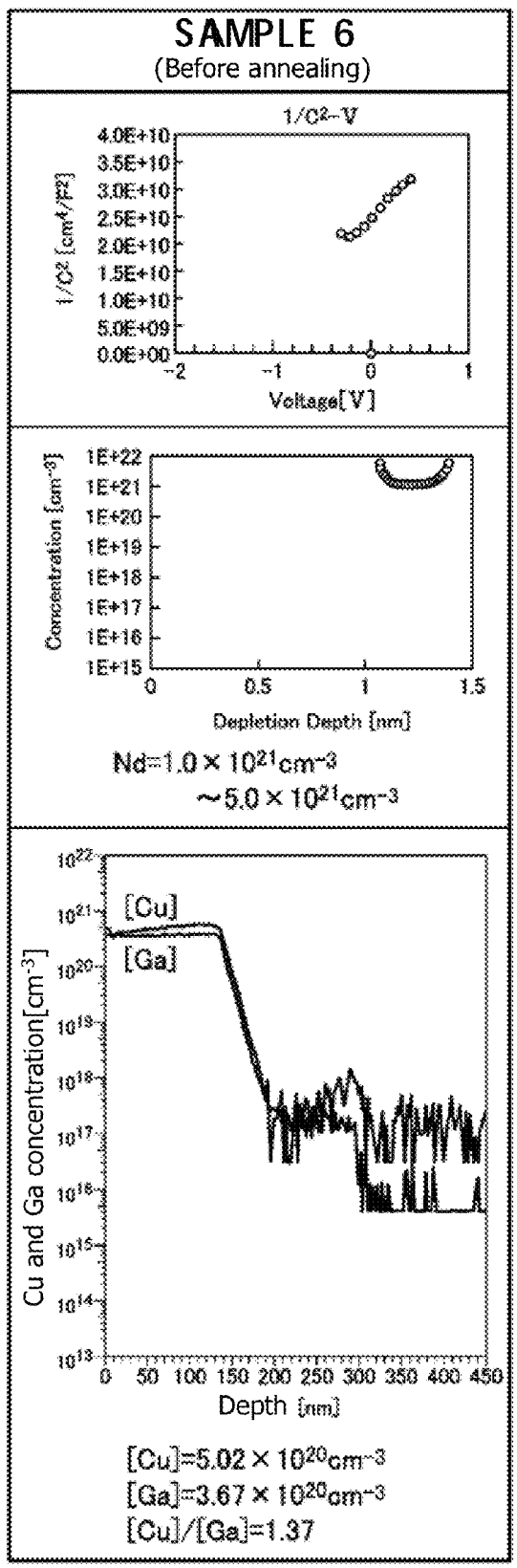
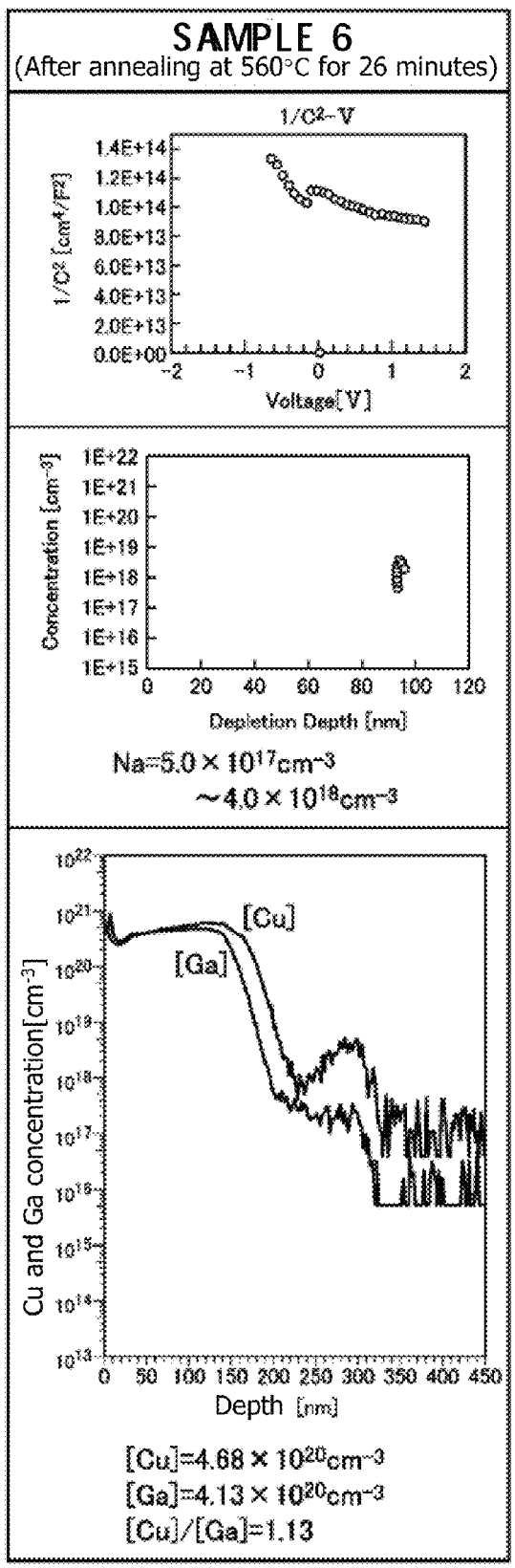

FIG.18A
FIG.18B
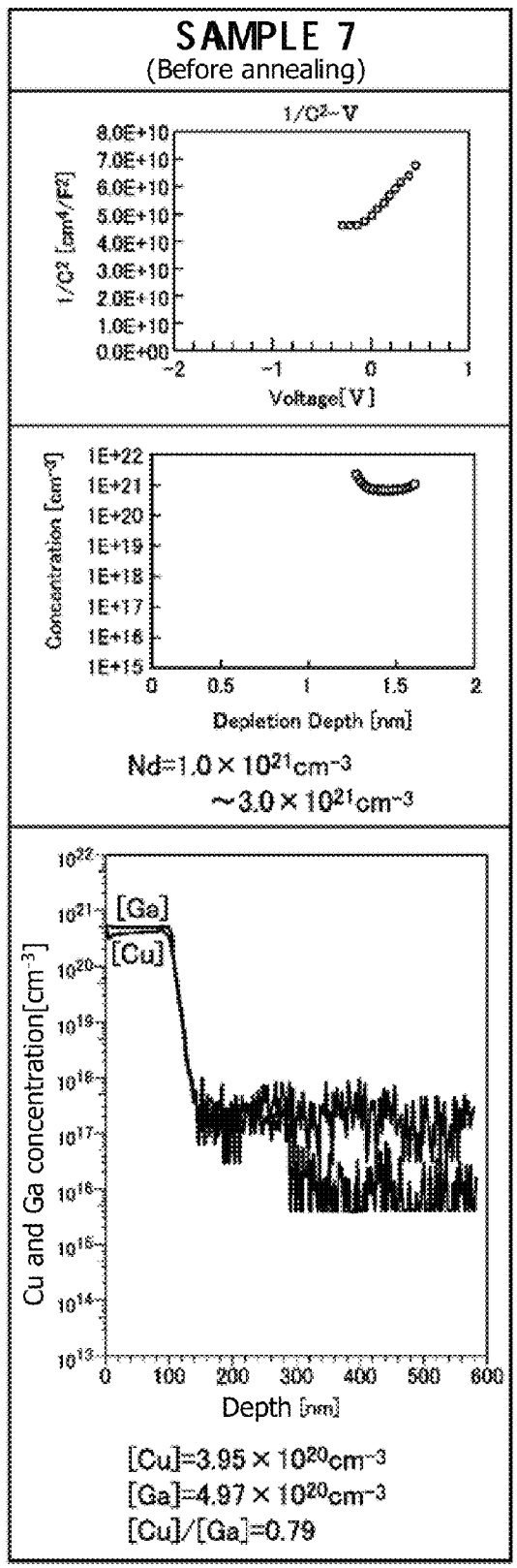
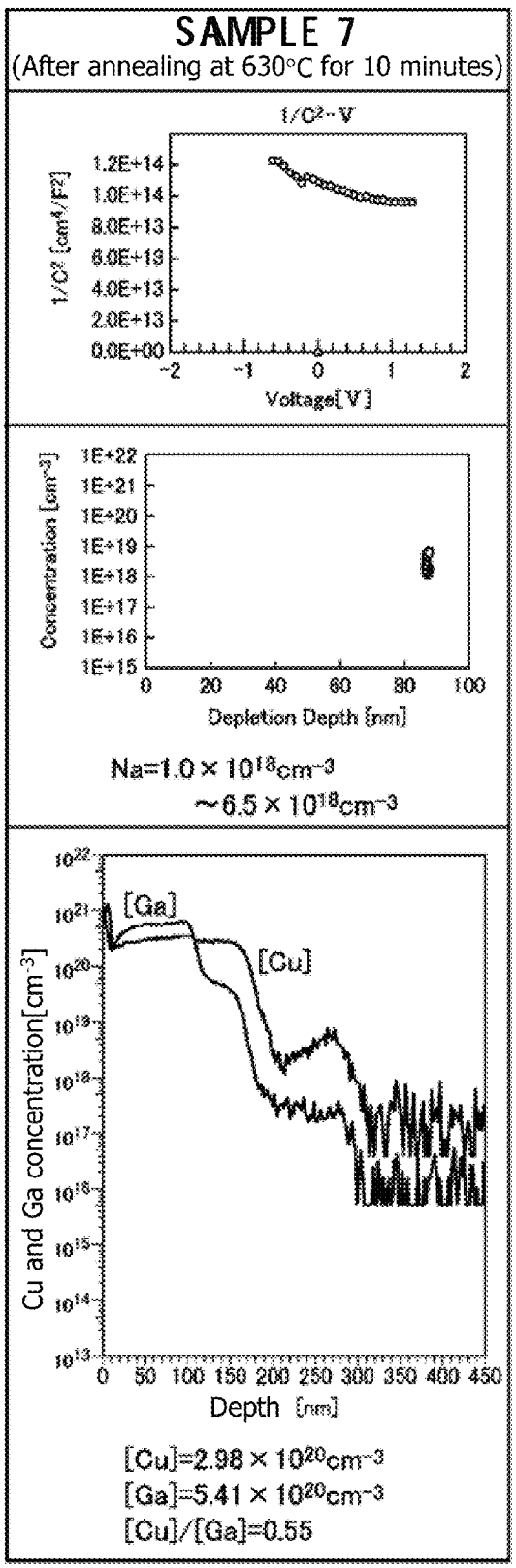

FIG.24

|  | Thickness of Ga-doped n-type $Mg_xZn_{1-x}O$ single crystal film | VI/II flux ratio in the deposition of Ga-doped n-type $Mg_xZn_{1-x}O$ single crystal film | Substrate temperature in the deposition of Ga-doped n-type $Mg_xZn_{1-x}O$ single crystal film |
|---|---|---|---|
| Example 2 | approximately 3.3 nm | 0.74 | 300°C |
| Example 3 | approximately 3.3 nm | 0.72 | 300°C |
| Example 4 | approximately 3.3 nm | 0.72 | 300°C |

FIG.25

|  | Thickness of Cu-doped n-type $Mg_xZn_{1-x}O$ single crystal film | VI/II flux ratio in the deposition of Cu-doped n-type $Mg_xZn_{1-x}O$ single crystal film | Substrate temperature in the deposition of Cu-doped n-type $Mg_xZn_{1-x}O$ single crystal film |
|---|---|---|---|
| Example 6 | approximately 1.7 nm | 0.82 | 250°C |
| Example 7 | approximately 2.0 nm | 0.70 | 250°C |
| Example 8 | approximately 2.0 nm | 0.70 | 250°C |

US 9,064,791 B2

METHOD FOR PRODUCING P-TYPE ZNO BASED COMPOUND SEMICONDUCTOR LAYER, METHOD FOR PRODUCING ZNO BASED COMPOUND SEMICONDUCTOR ELEMENT, AND AN N-TYPE ZNO BASED COMPOUND SEMICONDUCTOR LAMINATE STRUCTURE

CROSS-REFERENCE TO RELATED APPLICATIONS

This application is a divisional application of application Ser. No. 13/948,771 filed Jul. 23, 2013, the entire contents of which are incorporated by reference herein.

This application is based upon and claims the benefit of priority of the prior Japanese Patent Applications No. JP 2012-166833, No. JP 2012-166834, No. JP 2012-166835, No. JP 2012-166836, No. JP 2012-166837, filed on Jul. 27, 2012, No. JP 2013-024013, filed on Feb. 12, 2013, and No. JP 2013-036824, filed on Feb. 27, 2013, the entire contents of which are incorporated herein by reference.

BACKGROUND OF THE INVENTION

A) Field of the Invention

This invention relates to a method for producing a p-type ZnO based compound semiconductor layer and a method for producing a ZnO based compound semiconductor element. This invention also relates to a p-type ZnO based compound semiconductor single crystal layer, a ZnO based compound semiconductor element, and an n-type ZnO based compound semiconductor laminate structure.

B) Description of the Related Art

Zinc oxide (ZnO) is a direct transition-type semiconductor which has a band gap energy at room temperature of 3.37 eV, with a relatively high exciton binding energy of 60 meV. Use of zinc oxide has the advantage of reduced raw material cost as well as smaller influence on environment and human body. Accordingly, there is a high demand for a light-emitting device using ZnO having a high efficiency and low power consumption with reduced burden on environment.

However, the ZnO based compound semiconductor suffers from difficulty in realizing p-type electroconductivity due to self-compensation effect caused by the strong ionic property. For example, investigations have been conducted to develop a p-type ZnO based compound semiconductor having practical properties by using, for example, a Group 15 element such as N, P, As, or Sb, a Group 1 element such as Li, Na, or K, and a Group 11 element such as Cu, Ag, or Au as an acceptor impurity (see, for example, Japanese Patent Application Laid Open Nos. 2001-48698, 2001-68707, 2004-221132, and 2009-256142, and Japanese Patent No. 4365530).

SUMMARY OF THE INVENTION

An object of the present invention is to provide a novel method for producing a p-type ZnO based compound semiconductor layer. Another object of the present invention is to provide a method for producing a ZnO based compound semiconductor element. Another object of the present invention is to provide a p-type ZnO based compound semiconductor single crystal layer, a ZnO based compound semiconductor element, and an n-type ZnO based compound semiconductor laminate structure.

According to an aspect of the present invention, there is provided a method for producing a p-type ZnO based compound semiconductor layer comprising the steps of (a) preparing an n-type single crystal ZnO based compound semiconductor structure containing a Group 11 element which is Cu and/or Ag and at least one Group 13 element selected from the group consisting of B, Ga, Al, and In; and (b) annealing the n-type single crystal ZnO based compound semiconductor structure to form a p-type ZnO based compound semiconductor layer co-doped with the Group 11 element and the Group 13 element.

The present invention provides a novel method for producing a p-type ZnO based compound semiconductor layer, a method for producing a ZnO based compound semiconductor element, a p-type ZnO based compound semiconductor single crystal layer, a ZnO based compound semiconductor element, and an n-type ZnO based compound semiconductor laminate structure.

BRIEF DESCRIPTION OF THE DRAWINGS

FIGS. 16A and 16B are respectively graphs showing CV properties, depth profile of the impurity concentration, and depth profile of [Cu] and [Ga] measured by SIMS of the alternate laminate structure of the specimens before the annealing and the position where the alternate laminate structure had been formed of the specimens after the annealing of Sample 6.

FIGS. 18A and 18B are respectively graphs showing CV properties, depth profile of the impurity concentration, and depth profile of [Cu] and [Ga] measured by SIMS of the alternate laminate structure of the specimens before the annealing and the position where the alternate laminate structure had been formed of the specimens after the annealing of Sample 7.

FIG. 24 is a table summarizing conditions used in forming the Ga-doped n-type $Mg_xZn_{1-x}O$ single crystal film in Examples 2 to 4.

FIG. 25 is a table summarizing conditions used in forming the Ga-doped n-type $Mg_xZn_{1-x}O$ single crystal film in Examples 6 to 8.

DESCRIPTION OF EMBODIMENTS

First, the crystal formation apparatus used in the growth of ZnO based compound semiconductor film and the like is described. In the Experiments and Examples, the method used for the crystal formation is molecular beam epitaxy (MBE). The ZnO based compound semiconductor contains at least Zn and O.

Figure 1:
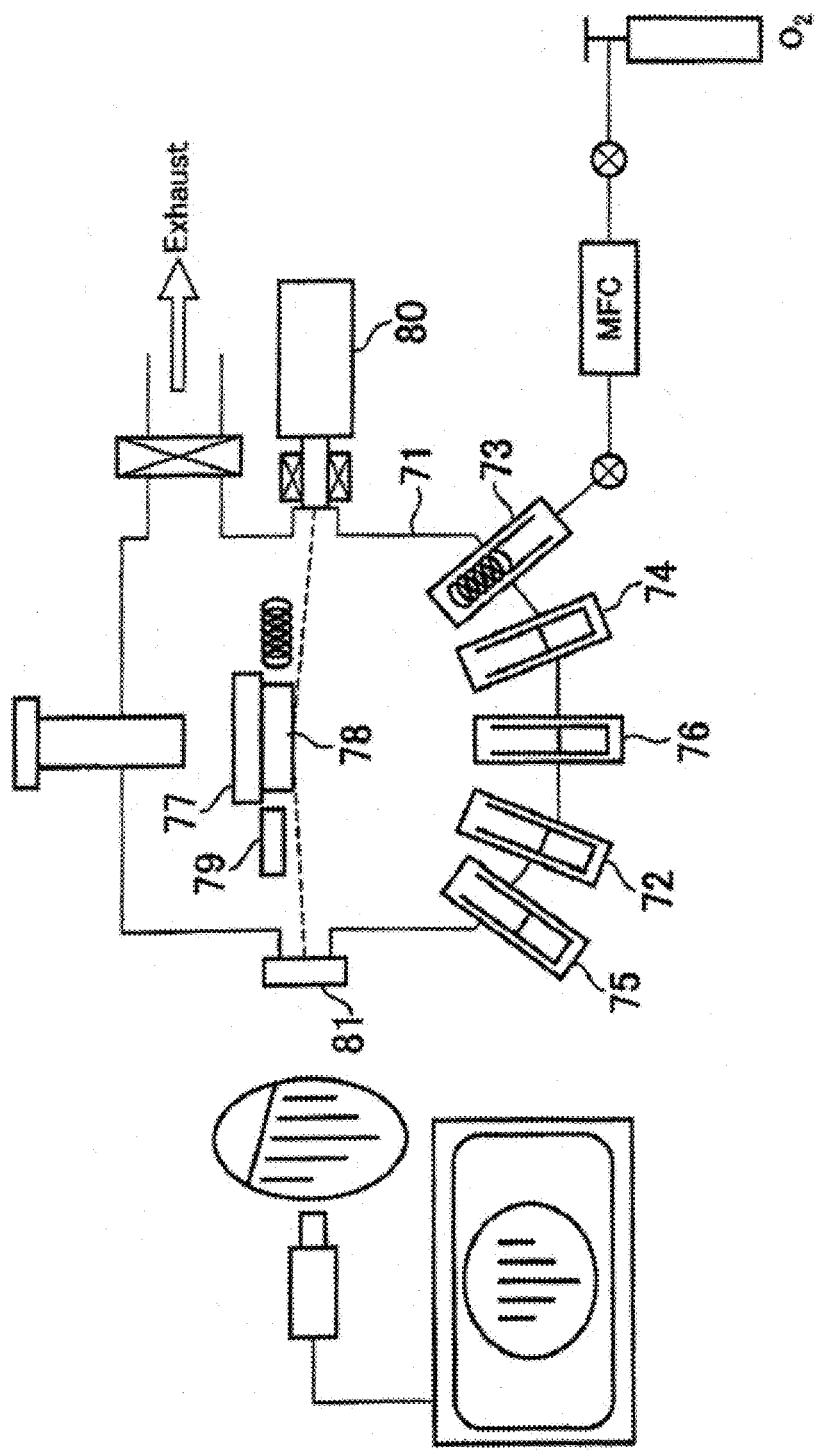
FIG. 1 is a schematic cross sectional view of an MBE apparatus.

FIG. 1 is a schematic cross sectional view illustrating MBE apparatus. The apparatus has a vacuum chamber 71, and a Zn source gun 72, an O source gun 73, a Mg source gun 74, a Cu source gun 75, and a Ga source gun 76 are accommodated in the vacuum chamber 71.

The Zn source gun 72, the Mg source gun 74, the Cu source gun 75, and the Ga source gun 76 respectively include Knudsen cell for accommodating solid source of Zn(7N), Mg(6N), Cu(9N), and Ga(7N), and Zn beam, Mg beam, Cu beam, and Ga beam are ejected when the cell is heated.

The O source gun 73 includes an electrodeless discharge tube which uses a radio frequency wave of, for example, 13.56 MHz, and plasma is produced in the electrodeless discharge tube from the $O_2$ gas (6N) and the O radical beam is ejected. The discharge tube may be the one prepared from alumina or high purity quartz.

A substrate 78 is held by a stage 77 having a substrate heater. Each of the source guns 72 to 76 is provided with a cell shutter, the substrate 78 becomes irradiatable and non-irradiatable by the beam when the cell shutter is opened and closed. The substrate 78 is irradiated by the beam at the desired timing for the growth of the ZnO based compound semiconductor film having the desired composition.

The band gap can be increased by adding Mg to the ZnO. However, phase separation occurs when Mg composition is too high since ZnO has wurtzite structure (hexagonal crystal) and MgO has rock salt structure (cubic crystal). In the $Mg_xZn_{1-x}O$ where Mg composition in the MgZnO is x, x is preferably up to 0.6 to maintain the wurtzite structure. The representation $Mg_xZn_{1-x}O$ includes ZnO with no addition of the Mg wherein x is 0.

n-type electroconductivity of the ZnO based compound semiconductor can be realized without doping any impurities. However, the n-type electroconductivity can be increased by doping impurities such as Ga. p-type electroconductivity of the ZnO based compound semiconductor can be realized by doping p-type impurities.

A thickness gauge 79 using a quartz oscillator is accommodated in the vacuum chamber 71, and flux intensity of each beam may be measured by film deposition rate measured by the thickness gauge 79.

The vacuum chamber 71 also has a gun 80 for reflection high energy electron diffraction (RHEED) and a screen 81 for RHEED image. The RHEED image helps evaluation of surface evenness and growth mode of the crystal layer formed on the substrate 78.

When the crystal growth is two dimensional epitaxial growth (single crystal growth) with flat surface, the RHEED image will exhibit a streak pattern, and when the crystal growth is three dimensional epitaxial growth (single crystal growth) with non-flat surface, the RHEED image will exhibit a spotted pattern. In the case of polycrystal growth, the RHEED image will exhibit a ring pattern.

Next, VI/II flux ratio in the $Mg_xZn_{1-x}O$ (0≤x≤0.6) crystal growth is explained, and in the explanation, $J_{Zn}$ represents the flux intensity of the Zn beam, $J_{Mg}$ represents flux intensity of the Mg beam, and $J_O$ represents the flux intensity of the O radical beam. The beams of Zn and Mg which are metal materials are respectively beams containing Zn or Mg atoms or clusters of several Zn or Mg atoms. Both atoms and clusters are effective for the crystal growth. The beam of O which is a gas material is a beam containing atom radical or neutral molecule, and the flux intensity of O considered herein is the flux intensity of the atom radical which is effective in the crystal growth.

$k_{Zn}$ represents attachment coefficient of Zn which is probability of the Zn becoming attached to the crystal, $k_{Mg}$ represents attachment coefficient of Mg which is probability of the Mg becoming attached to the crystal, and $k_O$ represents attachment coefficient of O which is probability of the O becoming attached to the crystal. Product $k_{Zn}J_{Zn}$ of the Zn attachment coefficient $k_{Zn}$ and flux intensity $J_{Zn}$, and product $k_O J_O$ of the 0 attachment coefficient $k_O$ and the flux intensity $J_O$ respectively correspond to number of Zn atoms, Mg atoms, and O atoms which attaches to unit area of the substrate in unit time.

VI/II flux ratio is defined as the ratio of the $k_O J_O$ to the sum of $k_{Zn} J_{Zn}$ and $k_{Mg} J_{Mg}$, namely, $k_O J_O/(k_{Zn} J_{Zn}+k_{Mg} J_{Mg})$. The condition wherein VI/II flux ratio is less than 1 is referred to as "Group II rich condition" (or simply "Zn rich condition" when Mg is not present), the condition wherein VI/II flux ratio is equal to 1 is referred to as "stoichiometric condition", and the condition wherein VI/II flux ratio is greater than 1 is referred to as "Group VI rich condition" (or "O rich condition").

For the crystal growth on Zn face (+c face), attachment coefficient $k_{Zn}$, $k_{Mg}$, and $k_O$ can be regarded 1 when surface temperature of the substrate is up to 850° C., and the VI/II flux ratio may be represented by $J_O/(J_{Zn}+J_{Mg})$.

VI/II flux ratio can be calculated, for example, in the case of ZnO growth, by measuring the Zn flux as a Zn deposition speed $F_{Zn}$ (nm/s) at room temperature by using a film thickness monitor using a quartz oscillator, and converting the $F_{Zn}$ (nm/s) to the $J_{Zn}$ (atoms/cm²s).

On the other hand, O radical flux may be calculated by irradiating the O radical beam at a constant condition (for example, at an RF power of 300 W and an $O_2$ flow rate of 2.0 sccm) while changing the Zn flux to allow the ZnO growth; experimentally determining dependency of the ZnO growth rate on the Zn flux; fitting the results by using approximate expression of the ZnO growth rate $G_{ZnO}$: $G_{ZnO} = [(k_{Zn} J_{Zn})^{-1} + (k_O J_O)^{-1}]^{-1}$ to thereby calculate O radical flux $J_O$ under such condition; and Calculating the VI/II flux ratio from the thus obtained Zn flux $J_{Zn}$ and O radical flux $J_O$.

The inventors of the present invention proposed a novel technique for doping a ZnO based compound semiconductor with Cu in the related art application (Japanese Patent Application No. 2012-41096). This proposal is based on the experimental result that, when Zn, O, and Cu are simultaneously supplied and a Cu-doped ZnO film is allowed to grow by MBE, a polycrystalline film with coarse surface is formed by three dimensional growth and Cu is not uniformly doped in the film thickness direction.

For such experimental results, the inventors of the present invention considered that simultaneous feeding of the Zn, O, and Cu promoted the reaction between the active O radical and the Cu, and this resulted formation of different crystalline phase of CuO at a pace higher than the substitution of the Zn site by the Cu and this invited ZnO growth inhibition, and hence, polycrystallization.

The inventors considered that, when Zn, O radical, and Cu are simultaneously supplied in the in the growth of the Cu-doped ZnO film, formation of the CuO(II) is facilitated since Cu readily reacts with the active O radical, and formation of the divalent $Cu^{2+}$ will be dominant. In addition, since thermal decomposition of the CuO(II) into $Cu_2O$(I) occurs at a temperature higher than the temperature of the Cu-doped ZnO film growth, it was estimated that the divalent $Cu^{2+}$ is less likely to be converted into the monovalent $Cu^+$, and hence, Cu which does not function as an acceptor in the ZnO will be dominant.

The inventors of the present invention considered that a method forming the Cu-doped ZnO layer wherein monovalent $Cu^+$ is more likely to be formed than the divalent $Cu^{2+}$ and Cu readily substitutes the Zn sites should facilitate two dimensional growth and p-type electroconductivity, and proposed in this related art application a production method of the Cu-doped p-type $Mg_x Zn_{1-x}O$ ($0 \leq x \leq 0.6$) layer, for example, by alternately repeating the cycle of forming a $Mg_x Zn_{1-x}O$ ($0 \leq x \leq 0.6$) single crystal film and supplying Cu on the $Mg_x Zn_{1-x}O$ ($0 \leq x \leq 0.6$) single crystal film. The production method according to the related art is capable of producing a Cu-doped p-type $Mg_x Zn_{1-x}O$ single crystal layer with improved evenness and crystallinity.

The invention of this application relates to a production method of the p-type ZnO based compound semiconductor film and a production method of the ZnO based compound semiconductor element different from the one proposed in the related art application, and in the present invention, the p-type ZnO based compound semiconductor layer is produced, for example, by a method comprising the steps of preparing a single crystal n-type ZnO based compound semiconductor structure containing a Group 11 element which is Cu and/or Ag and at least one Group 13 element selected from the group consisting of B, Ga, Al, and In; and annealing the single crystal n-type ZnO based compound semiconductor to form a p-type ZnO based compound semiconductor layer co-doped with the Group 11 element and the Group 13 element. In the production method according to the present invention, the monovalent $Cu^+$ formed functions as an acceptor at an efficiency higher than the related art proposal.

First, the first experiment of the inventors of the present invention is described. The inventors of the present invention found that the Ga-doped ZnO single crystal film having Cu supplied on the film (the alternate laminate structure) is converted to a p-type film by annealing. The experiment will be described for four samples, namely, Sample 1 to Sample 4, and in the following description, the specimen before the annealing is referred to as the pre-annealing specimen and the specimen after staring the annealing is referred to as the post-annealing specimen.

Figure 2A:
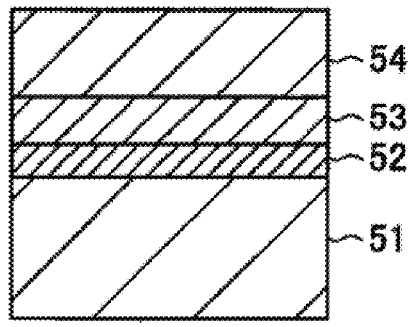
FIG. 2A is a schematic cross sectional view of the specimen before annealing.

The method used for preparing the pre-annealing specimen of Sample 1 is described. FIG. 2A is a schematic cross sectional view of the pre-annealing specimen.

A Zn face ZnO (0001) substrate (hereinafter referred to as the ZnO substrate) 51 having n-type electroconductivity was thermally cleaned at 900° C. for 30 minutes, and the temperature of the substrate 51 was reduced to 300° C. At this temperature (growth temperature, 300° C.), a ZnO buffer layer 52 having a thickness of 30 nm was deposited on the ZnO substrate 51 by using the Zn flux $F_{Zn}$ at 0.17 nm/s ($J_{Zn}$=1.1×10¹⁵ atoms/cm²s) and the O radical beam at an RF power of 300 W and an $O_2$ flow rate of 2.0 sccm ($J_O$=8.1×10¹⁴ atoms/cm²s). Annealing was then conducted at 900° C. for 10 minutes for improvement of crystallinity and surface evenness of the ZnO buffer layer 52.

On this ZnO buffer layer 52, an undoped ZnO layer 53 having a thickness 100 nm was deposited at a growth temperature of 900° C. by using a Zn flux $F_{Zn}$ of 0.17 nm/s ($J_{Zn}$, =1.1×10¹⁵ atoms/cm²s) and the O radical beam at an RF power of 300 W and an $O_2$ flow rate of 2.0 sccm ($J_O$=8.1×10¹⁴ atoms/cm²s). This undoped ZnO layer 53 was an n-type ZnO layer. Zn, 0, and Ga were supplied at a timing different from Cu on the undoped ZnO layer 53 to form an alternate laminate structure 54. The alternate laminate structure 54 was formed at a temperature of 300° C.

Figure 2B:
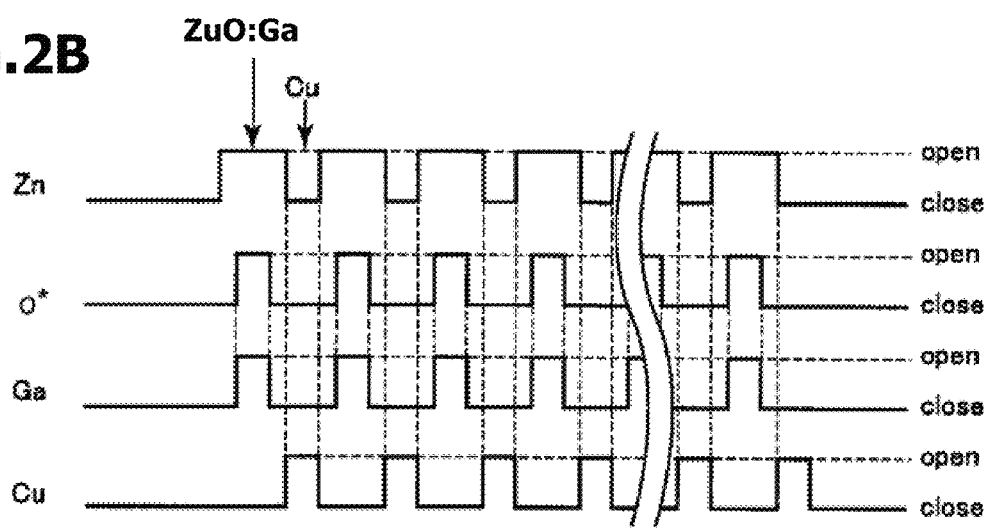
FIG. 2B is a time chart of shutter sequence of Zn cell, O cell, Ga cell, and Cu cell during formation of the alternate laminate structure.

FIG. 2B is a time chart showing shutter sequence of the Zn cell, the O cell, the Ga cell, and the Cu cell in forming the alternate laminate structure.

In forming the alternate laminate structure 54, the step of forming the Ga-doped ZnO single crystal film by opening the Zn cell shutter, the O cell shutter, and the Ga cell shutter and closing the Cu cell shutter and the step of Cu attachment (the step of forming the Cu layer) by closing the Zn cell shutter, the O cell shutter, and the Ga cell shutter and opening the Cu cell shutter were alternately repeated. Since the step of forming the Ga-doped ZnO single crystal film and the step of attaching Cu on the Ga-doped ZnO single crystal film is separately conducted with no overlap between the period when the O cell shutter is open and the period when the Cu cell shutter is open, the O radical and the Cu will not be simultaneously supplied.

In the step of forming the Ga-doped ZnO single crystal film, the opening and closing the O cell shutter and the Ga cell shutter are simultaneously conducted, and the Zn cell shutter is opened before opening the O cell shutter and the Ga cell shutter and closed after closing the O cell shutter and the Ga cell shutter, and in other words, the open period of the Zn cell shutter include the open period of the O cell shutter and the Ga cell shutter. Since the O radical the Cu are not simultaneously supplied and the surface of the Ga-doped ZnO single crystal film is covered by Zn before and after the Cu attachment step (thereby inhibiting the exposure of the O), direct reaction between the O radical and the Cu is prevented.

In the preparation of the pre-annealing specimen of Sample 1, the open period of the O cell shutter and the Ga cell shutter was 16 seconds for each opening, and the open period of the Zn cell shutter was extended 1 second before and after the open period of the O cell shutter and the Ga cell shutter. The open period of the Zn cell shutter was 18 seconds for each opening, and the 16 second period when all of the Zn cell shutter, the O cell shutter, and the Ga cell shutter were open was the period allowed for each Ga-doped ZnO single crystal film growth period. The open period of the Cu cell shutter was 10 seconds for each opening.

Each of the step of forming the Ga-doped ZnO single crystal film and the Cu attachment step were alternately repeated for 140 times to deposit the alternate laminate structure 54 having a thickness of 480 nm. In the formation of the Ga-doped ZnO single crystal film, the Zn flux $F_{Zn}$ was 0.17 nm/s ($J_{Zn}$=1.1×10$^{15}$ atoms/cm$^2$s), the O radical beam was irradiated at an RF power 300 W and an O$_2$ flow rate 2.0 sccm ($J_O$=8.1×10$^{14}$ atoms/cm$^2$s), and the Ga cell temperature $T_{Ga}$ was 490° C. VI/II flux ratio was 0.74 (Zn rich condition). In the Cu attachment step, the Cu cell temperature $T_c$, was 930° C., and the Cu flux $F_{Cu}$ was 0.0015 nm/s.

Figure 2C:
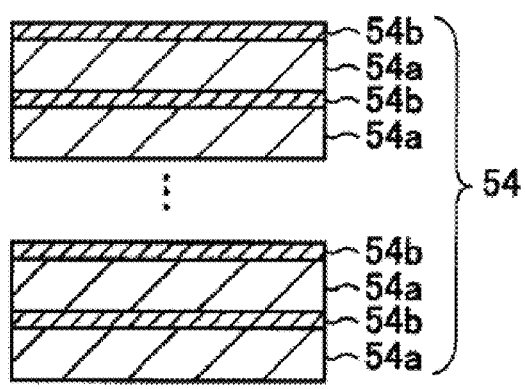
FIG. 2C is a schematic cross sectional view of an alternate laminate structure 54.

FIG. 2C is a schematic cross sectional view of the alternate laminate structure 54. The alternate laminate structure 54 has a structure wherein a Ga-doped ZnO single crystal films 54a and a Cu layers 54b are alternately laminated one on another. This laminate structure may also be regarded as a laminate structure comprising 140 layers of the Ga-doped ZnO single crystal films 54a each having the Cu supplied thereon disposed one on another in thickness direction.

The Ga-doped ZnO single crystal film 54a has a thickness of approximately 3.3 nm, and the Cu layer 54b has a thickness (Cu attachment thickness) of up to 1 atomic layer, for example, about ½0 atomic layer. In this case, Cu coverage of the surface of the Ga-doped ZnO single crystal film 54a will be approximately 5%.

Figure 2D:
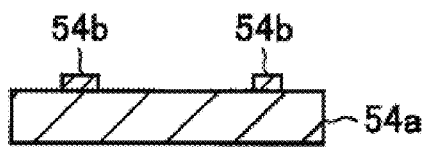
FIG. 2D is a schematic cross sectional view of a Ga-doped ZnO single crystal film 54a and a Cu layer 54b.

FIG. 2D is a schematic cross sectional view of the Ga-doped ZnO single crystal film 54a and the Cu layer 54b. For example, the Cu layer 54b having a thickness of about ½0 atomic layer is formed by Cu attached to a part of the surface of the Ga-doped ZnO single crystal film 54a as shown in FIG. 2D. For the simplicity of the drawing, the alternate laminate structure is shown by the layer structure of FIG. 2C including such embodiment of Cu attachment.

Figure 3:
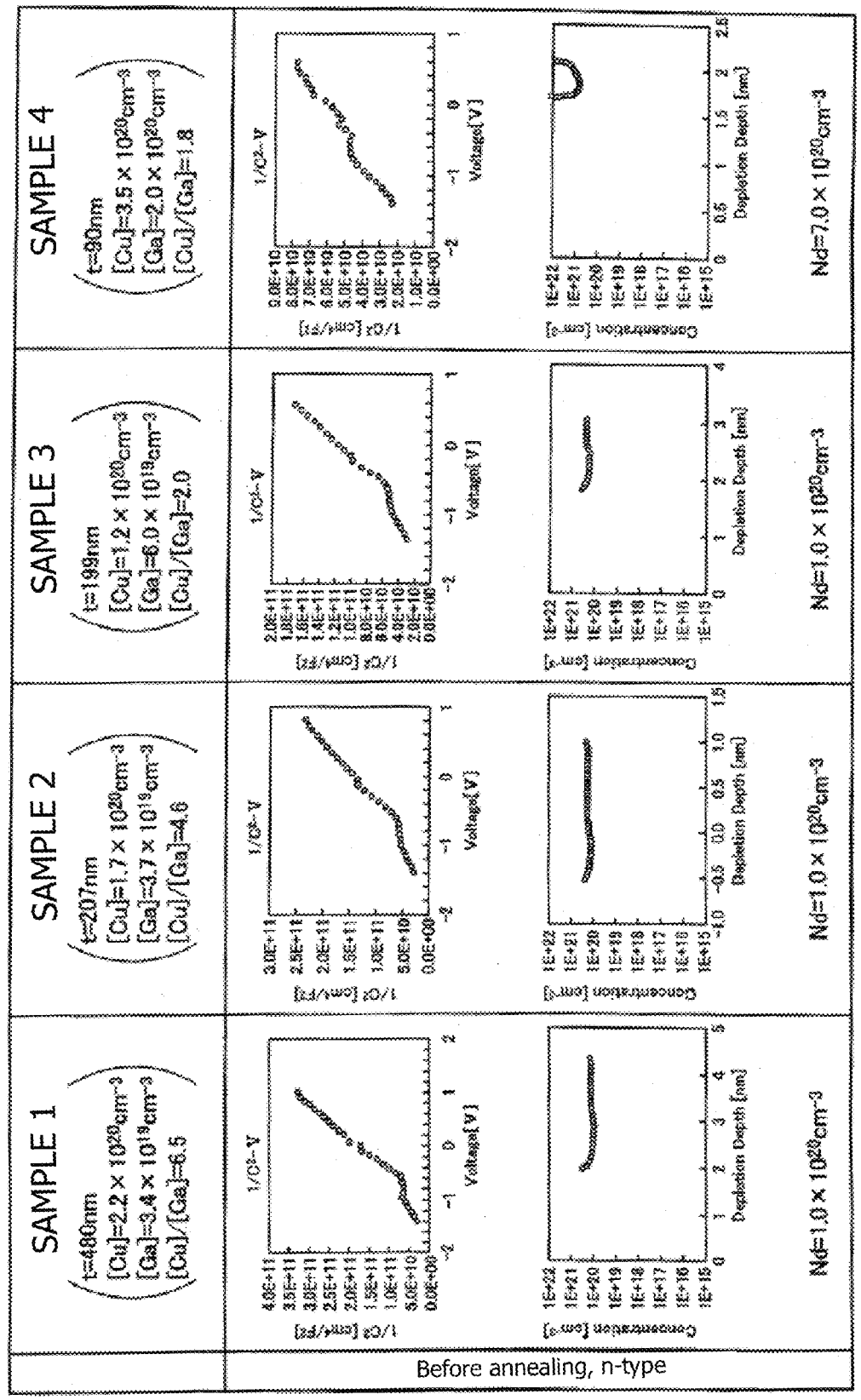
FIG. 3 shows graphs of CV properties and depth profile of impurity concentration of the alternate laminate structure of the specimens before the annealing.

FIG. 3 shows graphs of CV profile and depth profile of the impurity concentration of the alternate laminate structure for the pre-annealing specimens. The upper graph is the one showing the CV profile and the lower graph is the one showing the depth profile. The measurement was conducted by ECV using the electrolyte for the Schottky electrode, and the graph shows the results analyzed by parallel model. The leftmost graphs are those for Sample 1, and in FIG. 3, graphs for Sample 1 to Sample 4 are shown from left to right including the samples that will be described below. In the graph showing the CV profile, the x axis represents voltage (unit, "V") and the y axis represents "1/C$^2$" (unit, "cm$^4$/F$^2$"). Both axes are in linear scale. In the graph showing the depth profile, x axis represents position (unit "nm") in the depth (thickness) direction of the specimen. The y axis represents the impurity concentration (unit, "cm$^{-3}$"). In this graph, the x axis is in linear scale and the y axis is in logarithmic scale.

With regard to the graph showing the CV profile of Sample 1, the curve rises upward to the right (namely, 1/C$^2$ increases with the increase in the voltage), and this means that the Ga-doped ZnO single crystal film 54a with Cu supplied on the film surface (the alternate laminate structure 54) has n-type electroconductivity. It is to be noted that the inclination corresponds to the value of resistance.

With regard to the graph showing the depth profile of Sample 1, impurity concentration (donor concentration) $N_d$ in the alternate laminate structure 54 of the pre-annealing specimen of Sample 1 is 1.0×10$^{20}$ cm$^{-3}$.

Next, annealing of the Sample 1 was conducted in the atmosphere at 650° C. for 30 minutes. After this annealing, annealing at the same temperature but for 10 minutes was repeated four times.

Figure 4:
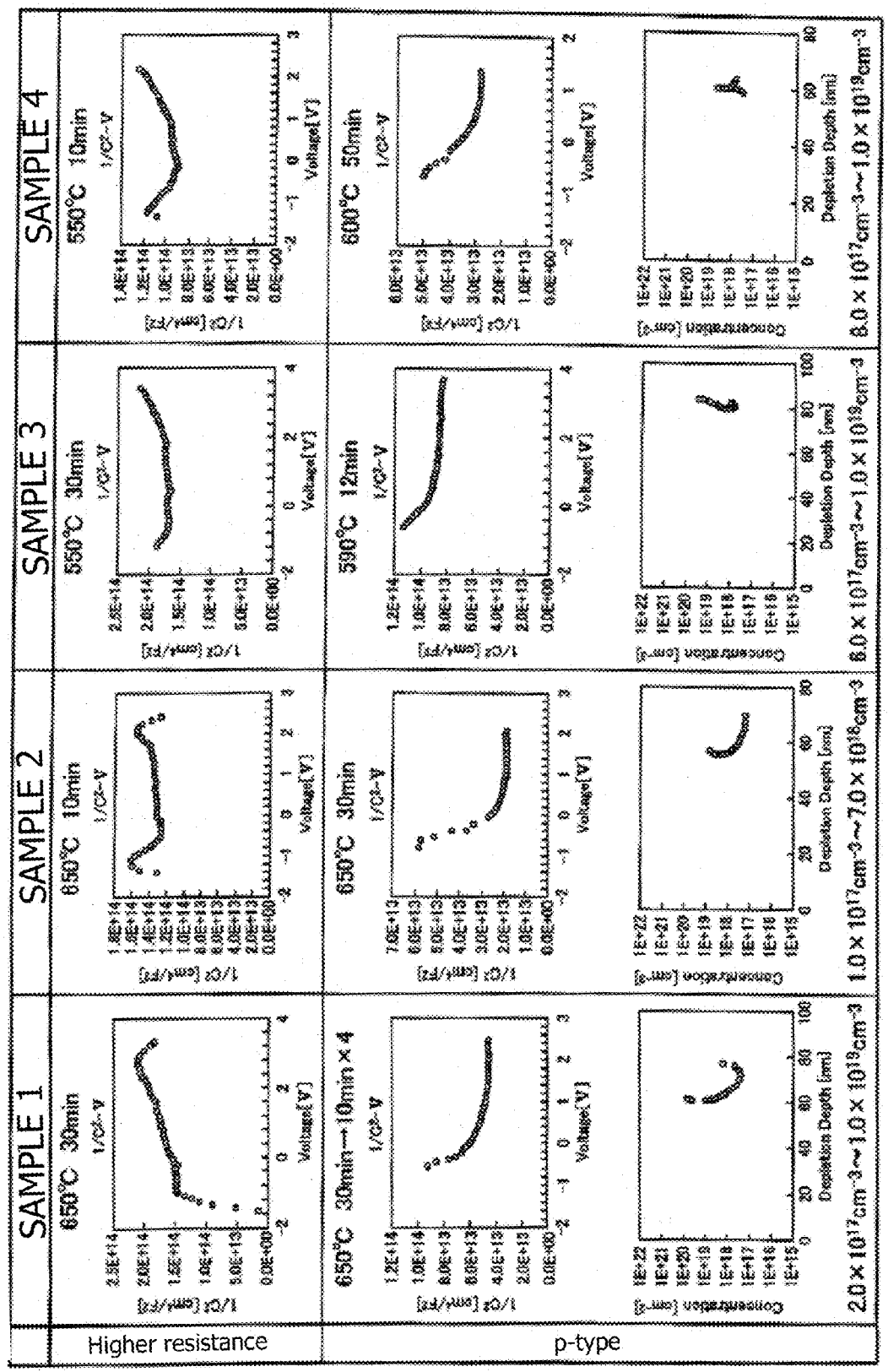
FIG. 4 shows graphs of CV properties and depth profile of impurity concentration of the alternate laminate structure of the specimens after the annealing.

FIG. 4 shows graphs depicting CV profile and depth profile of the impurity concentration of the post-annealing specimens. The CV profile and the depth profile of the position where the alternate laminate structure 54 had been formed are shown in the graph. The leftmost graphs are those for Sample 1, and as in the case of FIG. 3, graphs for the post-annealing specimens of Sample 1 to Sample 4 are shown from left to right including the samples that will be described below.

With regard to the column of Sample 1, the graph in the upper row shows the CV profile after annealing at 650° C. for 30 minutes, and the x and y axes are the same as the graph of the CV profile in FIG. 3. Compared with the pre-annealing specimen, resistance is higher at the position where the alternate laminate structure 54 (the Ga-doped ZnO single crystal film 54a having Cu supplied on the film surface) had been formed, and conceivably, this is due to the functioning of the Cu as a p-type impurity which reduces the functions of the Ga which is an n-type impurity.

In the lower part of the column, two graphs are shown which respectively depict the CV profile (upper graph) and the depth profile (lower graph) of the specimen which has been annealed once at 650° C. for 30 minutes, and then four times at 650° C. for 10 minutes, namely 70 minutes in total. The x and y axes of the graphs are the same as those in the graphs of FIG. 3.

In the upper graph showing the CV profile, the curve drops downward to the right (namely, 1/C$^2$ decreases with the increase in the voltage), and this means that the position where the alternate laminate structure 54 had been formed has p-type electroconductivity. Cu concentration per unit volume at the position where the alternate laminate structure 54 had been formed is higher than the Ga concentration, and this indicates that the dispersion of the Cu first results in the compensation of the Ga, and then, in the increase of the concentration of the p-type impurity. The lower graph showing the depth profile indicates that the impurity concentration (acceptor concentration) $N_a$ of the position where the alternate laminate structure 54 had been formed of the post-annealing specimen of Sample 1 is $2.0 \times 10^{17}$ cm$^{-3}$ to $1.0 \times 10^{19}$ cm$^{-3}$.

Figure 5:
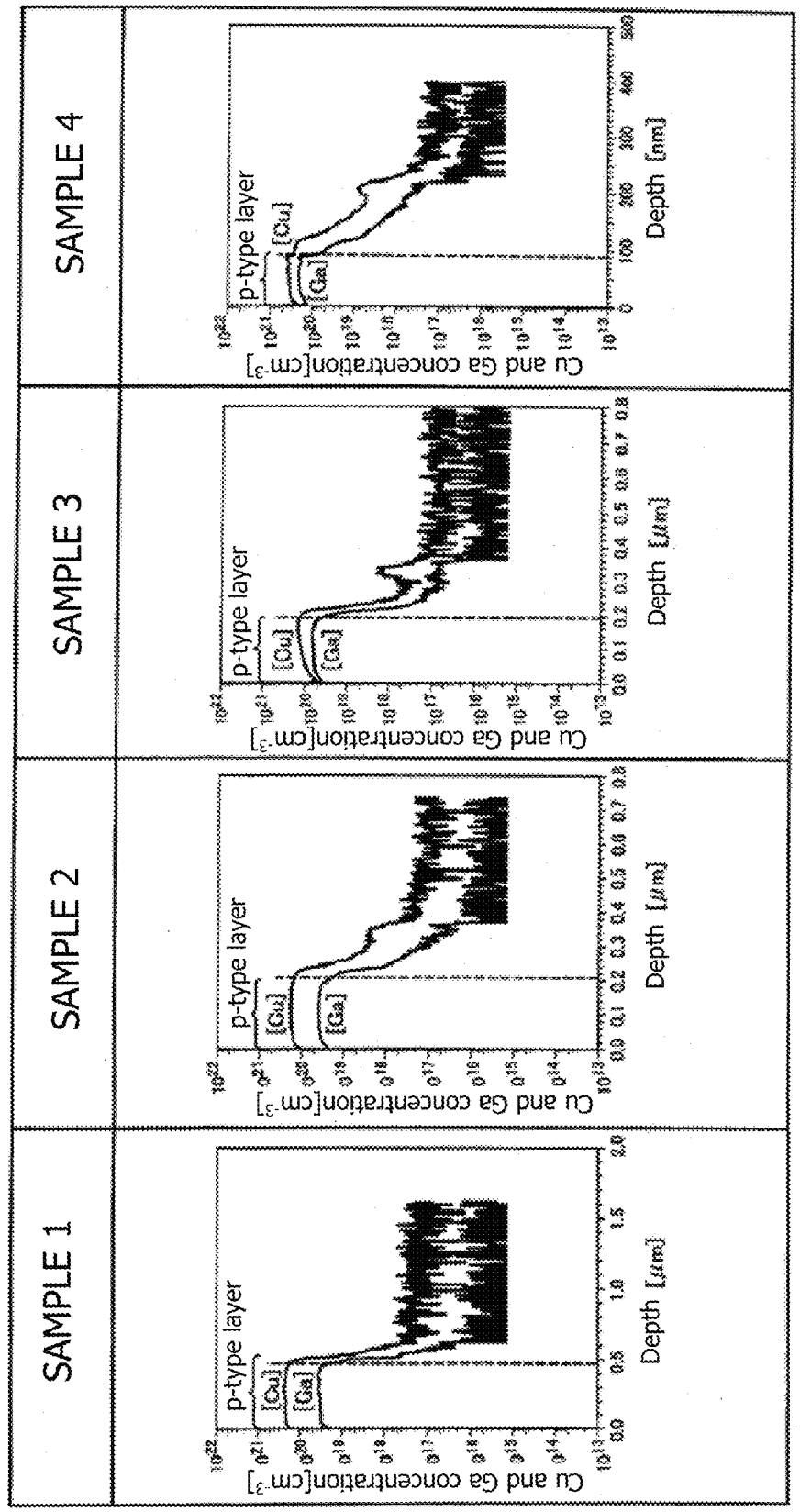
FIG. 5 shows graphs of depth profile of absolute concentration of Cu [Cu] and absolute concentration of Ga [Ga] after the annealing measured by SIMS.

FIG. 5 shows graphs of depth profile of the absolute concentration of Cu [Cu] and the absolute concentration of Ga [Ga] after the annealing measured by secondary ion mass spectrometry (SIMS). The leftmost graphs are those for Sample 1, and in FIG. 5, graphs for post-annealing specimens of Sample 1 to Sample 4 are shown from left to right including the samples that will be described below. In the graph, the x axis represents position in the depth direction of the post-annealing specimen and the y axis represents the Cu concentration [Cu] and the Ga concentration [Ga]. The position in the depth direction of the post-annealing specimen is by the unit "μm" for Sample 1 to Sample 3, and "nm" for Sample 4. Unit of the [Cu] and [Ga] is "cm$^{-3}$".

With regard to the column of Sample 1, the range in the depth of 0.0 μm to 0.48 μm is the position wherein a p-type layer has been formed corresponding to the position where alternate laminate structure 54 had been formed. The Cu concentration [Cu] is $2.2 \times 10^{20}$ cm$^{-3}$, and the Ga concentration [Ga] is $3.4 \times 10^{19}$ cm$^{-3}$, and as indicated in the graph, both are approximately constant through the thickness of the p-type layer. The term "approximately constant" used herein means that the concentration is within the range of 50% to 150% of the average concentration ($2.2 \times 10^{20}$ cm$^{-3}$ in the case of [Cu] of Sample 1). Cu is evenly distributed. [Cu] is higher than [Ga], and the ratio of [Cu] to [Ga] (namely, the value of [Cu]/[Ga]) is 6.5. It is to be noted that the [Cu] and [Ga] may not be accurately measured near the surface of the p-type layer, for example, due to the matters adsorbed on the surface. For example, a lower value is measured in the case of Sample 1.

Next, Sample 2 to Sample 4 are described. Samples 2 to 4 are samples prepared by adjusting the amount of Cu and Ga supplied during the production of the alternate laminate structure, and the value of [Cu]/[Ga] is different in each of Samples 2 to 4 from Sample 1.

The pre-annealing specimen of Samples 2 to 4 is similar to Sample 1 shown in FIG. 2A in that a ZnO buffer layer, an undoped ZnO layer, and an alternate laminate structure are disposed on the ZnO substrate 51 in this order. Samples 2 to 4, however, are different from Sample 1 in the conditions used for depositing the layers disposed on the ZnO substrate 51.

In the preparation of pre-annealing specimens of Samples 2 and 3, the ZnO buffer layer was deposited at a temperature of 300° C. and growth period of 5 minutes. More specifically, the ZnO buffer layer having a thickness of 40 nm was deposited by using a Zn flux $F_{Zn}$ of 0.16 nm/s, and irradiating the O radical beam at an RF power of 300 W and an O$_2$ flow rate of 2.0 sccm. Annealing was then conducted at 900° C. for 15 minutes.

The undoped ZnO layer was deposited at a temperature of 900° C. and growth period of 15 minutes. More specifically, the undoped ZnO layer having a thickness of 120 nm was deposited by using a Zn flux $F_{Zn}$ of 0.16 nm/s, and irradiating the O radical beam at an RF power of 300 W and the O$_2$ flow rate of 2.0 sccm.

The alternate laminate structure was deposited at a temperature 300° C. The Ga-doped ZnO single crystal film was deposited by using a Zn flux $F_{Zn}$ of 0.16 nm/s, and irradiating the O radical beam at an RF power of 300 W and an O$_2$ flow rate of 2.0 sccm. The VI/II flux ratio was less than 1 corresponding to the Zn rich conditions. Ga cell temperature $T_{Ga}$ was 498° C. in the preparation of Sample 2, and 505° C. in the preparation of Sample 3. Each growth period for Ga-doped ZnO single crystal film was set at 16 seconds. The cell temperature in Cu attachment step $T_{Cu}$, was 930° C., and the Cu flux $F_{Cu}$ was 0.0015 nm/s. Each open period for the Cu cell shutter was 10 seconds. The step of depositing the Ga-doped ZnO single crystal film and the Cu attachment step were alternately repeated 60 times to produce the alternate laminate structure. The growth period was 30 minutes. The alternate laminate structure had a thickness of 207 nm in Sample 2, and 199 nm in Sample 3. The pre-annealing specimens of Samples 2 and 3 were thereby prepared.

The method used for preparing the pre-annealing specimen of Sample 4 is different from those of Samples 2 and 3 in the conditions used in the deposition of the alternate laminate structure.

The alternate laminate structure of Sample 4 was formed at a temperature of 300° C. The Ga-doped ZnO single crystal film was deposited by using a Zn flux $F_{Zn}$ of 0.15 nm/s, and irradiating the O radical beam at an RF power of 300 W and an O$_2$ flow rate of 2.0 sccm. The VI/II flux ratio was less than 1 corresponding to the Zn rich conditions. Ga cell temperature $T_{Ga}$ was 525° C. The growth period for Ga-doped ZnO single crystal film was set at 16 seconds. The cell temperature in Cu attachment step $T_{Cu}$ was 930° C., and the Cu flux $F_{Cu}$ was 0.0015 nm/s. Each open period for the Cu cell shutter was 50 seconds. Each of the step of depositing the Ga-doped ZnO single crystal film and the Cu attachment step were alternately repeated 30 times to produce the alternate laminate structure having a thickness of 90 nm. The pre-annealing specimen of Sample 4 was thereby prepared.

With regard to the columns of Samples 2 to 4 in FIG. 3, the upper graph showing the CV profile demonstrates that the alternate laminate structure experiences increase in the $1/C^2$ with the increase in the voltage in Samples 2 to 4 as in the case of Sample 1. This in turn means that the alternate laminate structure (the Ga-doped ZnO single crystal film having Cu supplied on the film) of the pre-annealing specimen of Samples 2 to 4 has n-type electroconductivity.

The lower graphs showing the depth profile indicate that the donor concentration $N_d$ of the alternate laminate structure in Samples 2, 3, and 4 are respectively $1.0 \times 10^{20}$ cm$^{-3}$, $1.0 \times 10^{20}$ cm$^{-3}$, and $7.0 \times 10^{20}$ cm$^{-3}$.

Samples 2 to 4 were subsequently subjected to annealing.

With regard to the column of Sample 2 in FIG. 4, Sample 2 was divided into 2 parts, and one was subjected to annealing in the atmosphere at 650° C. for 10 minutes, and the other was subjected to annealing in the atmosphere at 650° C. for 30 minutes. The graph in the upper row shows CV profile of Sample 2 which has been subjected to the annealing at 650° C. for 10 minutes. At the position where the alternate laminate structure 54 (the Ga-doped ZnO single crystal film having Cu supplied on the film surface) had been formed, the resistance is higher compared to the pre-annealing resistance.

The graphs in the lower row respectively show the CV profile and the depth profile of the impurity concentration for Sample 2 which has been subjected to the annealing at 650° C. for 30 minutes.

In the upper graph showing the CV profile, $1/C^2$ decreases with the increase in the voltage, and this indicates that the position where the alternate laminate structure had been formed has changed to p-type. The lower graph showing the depth profile demonstrates that the acceptor concentration $N_a$ at the position where the alternate laminate structure had been formed in Sample 2 which had been subjected to the annealing at 650° C. for 30 minutes is $1.0 \times 10^{17}$ cm$^{-3}$ to $7.0 \times 10^{18}$ cm$^{-3}$.

The graph in the column of Sample 2 in FIG. 5 depicts depth profile of Cu concentration [Cu] and Ga concentration [Ga] of the specimen which has been annealed at 650° C. for 30 minutes measured by SIMS. In the range corresponding to the position where the alternate laminate structure had been formed (the position where p-type layer has been formed), the Cu concentration [Cu] is $1.7 \times 10^{20}$ cm$^{-3}$, the Ga concentration [Ga] id $3.7 \times 10^{19}$ cm$^{-3}$, and both are approximately constant through the thickness of the p-type layer. The [Cu]/[Ga] value is 4.6.

With regard to the column of Sample 3 in FIG. 4, Sample 4 was also annealed in the atmosphere. The annealing was conducted 7 times at 550° C. for 10 minutes, 4 times at 570° C. for 10 minutes, 3 times at 580° C. for 10 minutes, and once at 580° C. for 5 minutes, and then 590° C. for 12 minutes. The total annealing time was 157 minutes.

The graph in the upper row is a graph showing CV profile after conducting the annealing 3 times at 550° C. for 10 minutes (total annealing time, 30 minutes). Resistance of the position where the alternate laminate structure had been formed has increased compared with the resistance before the annealing.

The graphs in the lower row respectively show the CV profile and the depth profile of the impurity concentration for Sample 3 which has been subjected to the annealing at 590° C. for 12 minutes (total annealing time, 157 minutes).

In the upper graph showing the CV profile, $1/C^2$ decreases with the increase in the voltage, and this indicates that the position where the alternate laminate structure had been formed has changed to p-type. The lower graph showing the depth profile demonstrates that the acceptor concentration $N_a$ at the position where the alternate laminate structure had been formed in the post-annealing specimen of Sample 3 is $6.0 \times 10^{17}$ cm$^{-3}$ to $1.0 \times 10^{19}$ cm$^{-3}$.

With regard to the column of Sample 3 in FIG. 5, the range corresponding to the position where the alternate laminate structure has been formed (the position where p-type layer has been formed) has a Cu concentration [Cu] of $1.2 \times 10^{20}$ cm$^{-3}$ and a Ga concentration [Ga] of $6.0 \times 10^{19}$ cm$^{-3}$, and both are approximately constant through the thickness of the p-type layer. The value of [Cu]/[Ga] is 2.0.

With regard to the column of Sample 4 in FIG. 4, Sample 4 was prepared by conducting the annealing in the atmosphere at 500° C. for 10 minutes, at 525° C. for 10 minutes, and at 550° C. for 10 minutes, and then repeating the annealing 5 times at 600° C. for 10 minutes. The total annealing time was 80 minutes.

The graph in the upper row shows CV profile after the annealing at 550° C. for 10 minutes. At the position where the alternate laminate structure had been formed, the resistance is higher compared to the pre-annealing resistance.

The graphs in the lower row respectively show the CV profile and the depth profile of the impurity concentration for the specimen after the annealing at 600° C. for 50 minutes (the annealing of 10 minutes for 5 times) (80 minutes annealing in total).

In the upper graph showing the CV profile, $1/C^2$ decreases with the increase in the voltage, and this indicates that the position where the alternate laminate structure had been formed has changed to p-type. The lower graph showing the depth profile demonstrates that the acceptor concentration $N_a$ at the position where the alternate laminate structure had been formed in the post-annealing specimen of Sample 4 is $8.0 \times 10^{17}$ cm$^{-3}$ to $1.0 \times 10^{19}$ cm$^{-3}$.

With regard to the column of Sample 4 in FIG. 5, the Cu concentration [Cu] in the range corresponding to the position where the alternate laminate structure had been formed (the position where p-type layer has been formed) is $3.5 \times 10^{20}$ cm$^{-3}$, and the Ga concentration [Ga] is $2.0 \times 10^{20}$ cm$^{-3}$, and both are approximately constant in the thickness of the p-type layer. The [Cu]/[Ga] value is 1.8.

Next, Sample 5 is explained.

The pre-annealing specimen of Sample 5 is similar to Sample 1 shown in FIG. 2A in that the ZnO buffer layer 52, the undoped ZnO layer 53, and the alternate laminate structure are disposed on the ZnO substrate 51 in this order. Sample 5, however, is different from Sample 1 in the conditions used for depositing the alternate laminate structure.

The alternate laminate structure of Sample 5 was deposited at a temperature of 300° C. In the deposition of the Ga-doped ZnO single crystal film, Zn flux $F_{Zn}$ was 0.15 nm/s ($J_{Zn}$=9.9×$10^{14}$ atoms/cm$^2$s), and the O radical beam was irradiated at an RF power of 300 W and an O$_2$ flow rate of 2.0 sccm ($J_O$=8.1×$10^{14}$ atoms/cm$^2$s). The VI/II flux ratio was 0.82. The Ga cell temperature $T_{Ga}$ was 530° C. Each growth period for Ga-doped ZnO single crystal film was set at 16 seconds. The cell temperature in Cu attachment step $T_{Cu}$ was 890° C., and the Cu flux $F_{Cu}$ was 0.001 nm/s. Each open period for the Cu cell shutter was 80 seconds. Each of the step of depositing the Ga-doped ZnO single crystal film and the Cu attachment step were alternately repeated 30 times to produce the alternate laminate structure having a thickness of 80 nm.

Sample 5 was divided into 3 parts, and these parts were annealed in oxygen atmosphere at an O$_2$ flow rate of 1 L/min for 10 minutes respectively at an annealing temperature of 600° C., 620° C., and 630° C.

Figure 6:
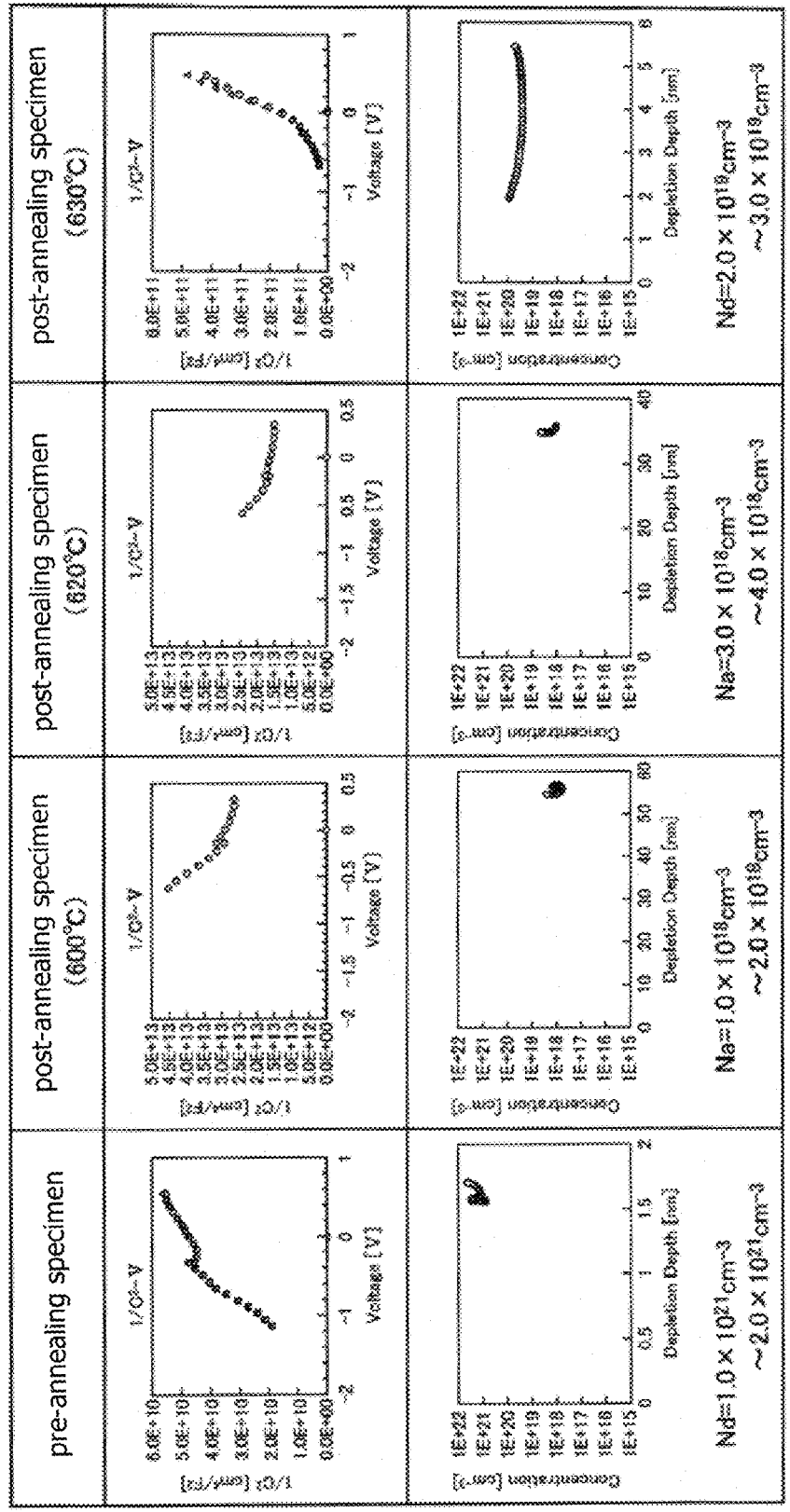
FIG. 6 shows graphs of CV properties and depth profile of impurity concentration of the alternate laminate structure and its corresponding position for Sample 5.

FIG. 6 shows graphs of the CV profile and the depth profile of the impurity concentration for the alternate laminate structure and its corresponding position of Sample 5. The graphs in the lower row respectively represents graphs of the CV profile, and graphs in the lower row respectively represents graphs of the depth profile. From left to right, the graphs are for the pre-annealing specimen and the post-annealing specimens annealed at 600° C., 620° C., and 630° C. The x and y axes are the same as the graphs shown in the lower column of FIGS. 3 and 4.

In the graph of the CV profile of the pre-annealing specimen, $1/C^2$ increases with the increase in the voltage, and this indicates that the alternate laminate structure has n-type electroconductivity. As shown in the graph of depth profile, the impurity concentration (donor concentration) $N_d$ of the pre-annealing specimen is $1.0 \times 10^{21}$ cm$^{-3}$ to $2.0 \times 10^{21}$ cm$^{-3}$.

In the graph showing the CV profile of the specimen annealed at 600° C., $1/C^2$ decreases with the increase in the voltage, indicating that the position where the alternate laminate structure had been formed has become p-type. The graph in the lower row shows that the impurity concentration (acceptor concentration) $N_a$ at the position where the alternate laminate structure had been formed is $1.0 \times 10^{18}$ cm$^{-3}$ to $2.0 \times 10^{18}$ cm$^{-3}$.

In the graph showing the CV profile of the specimen annealed at 620° C., $1/C^2$ also decreases with the increase in the voltage, indicating that the position where the alternate laminate structure had been formed has become p-type. The graph of the depth profile shows that the acceptor concentration $N_a$ at the position where the alternate laminate structure had been formed is $3.0 \times 10^{18}$ cm$^{-3}$ to $4.0 \times 10^{18}$ cm$^{-3}$.

In the case of the graph showing the CV profile of the specimen annealed at 630° C. for 10 minutes, $1/C^2$ increases with the decrease in the voltage, indicating that the position where the alternate laminate structure had been formed has n-type electroconductivity. As a result of excessive annealing, the position where the alternate laminate structure had been formed which had become p-type again became an n-type layer. The graph of the depth profile shows that the donor concentration $N_d$ at the position where the alternate laminate structure had been formed is $2.0 \times 10^{19}$ cm$^{-3}$ to $3.0 \times 10^{19}$ cm$^{-3}$.

Figure 7:
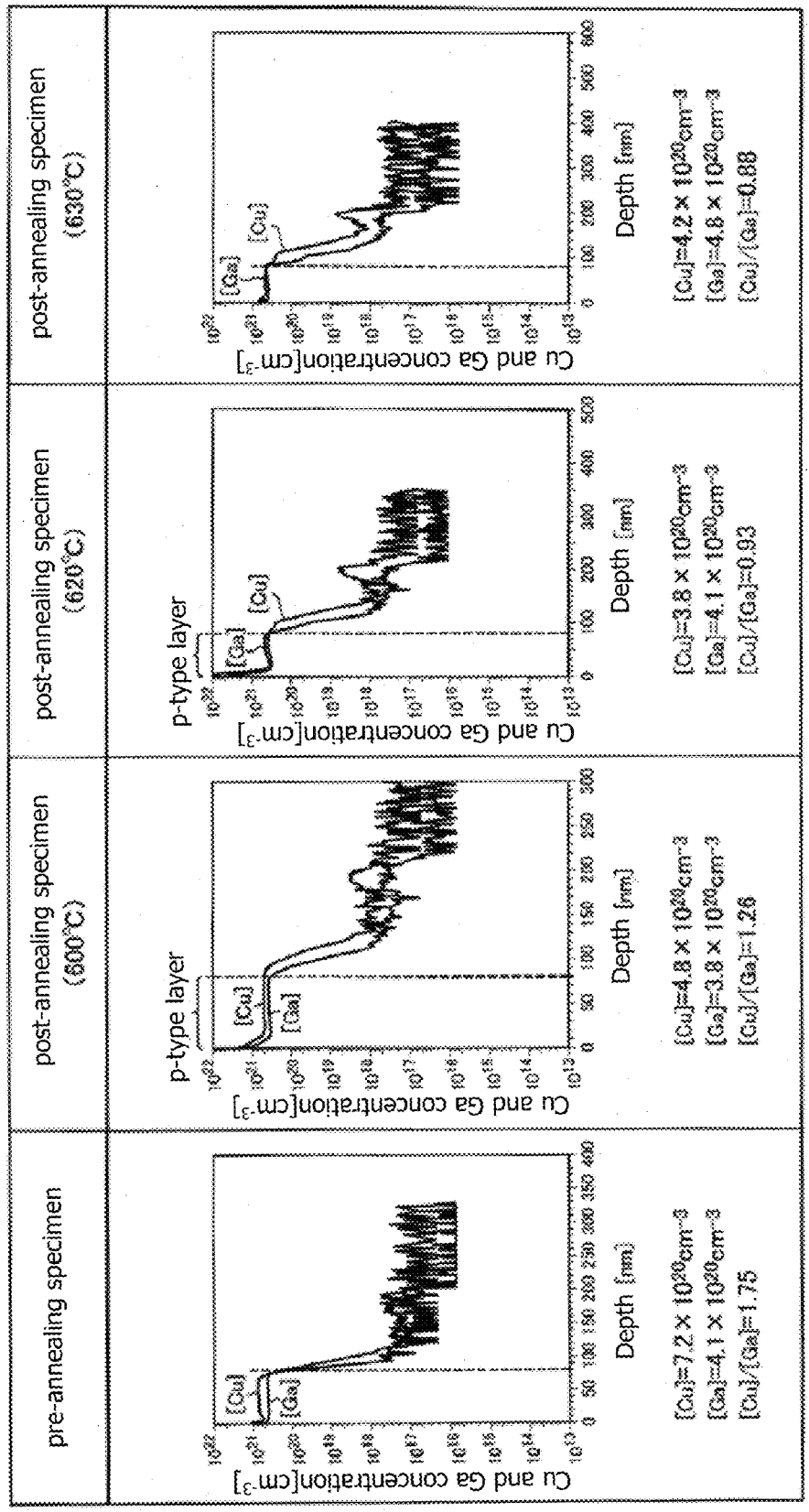
FIG. 7 shows graphs of depth profile of absolute concentration of Cu [Cu] and absolute concentration of Ga [Ga] after the annealing measured by SIMS.

FIG. 7 shows graphs depicting depth profile of the absolute concentration of Cu [Cu] and the absolute concentration of Ga [Ga] measured by SIMS. The graphs showing the depth profile of the pre-annealing specimen and the specimens respectively annealed at 600° C., 620° C., and 630° C. are shown from left to right. In the graph, the x axis represents position in the depth direction by the unit of "nm" while the y axis represents the Cu concentration [Cu] and the Ga concentration [Ga] by the unit of "cm$^{-3}$". The range in the depth of 0 nm to 80 nm corresponds to the alternate laminate structure and its corresponding position.

In the alternate laminate structure of the pre-annealing specimen, the Cu concentration [Cu] is $7.2 \times 10^{20}$ cm$^{-3}$, the Ga concentration [Ga] is $4.1 \times 10^{20}$ cm$^{-3}$, and the [Cu]/[Ga] is 1.75.

In the position corresponding to the position where the alternate laminate structure had been formed (the position where p-type layer has been formed) of the specimen annealed at 600° C., the Cu concentration [Cu] is $4.8 \times 10^{20}$ cm$^{-3}$, the Ga concentration [Ga] is $3.8 \times 10^{20}$ cm$^{-3}$, and both are approximately constant through the thickness of the p-type layer. The value of [Cu]/[Ga] value is 1.26.

In the position corresponding to the position where the alternate laminate structure had been formed (the position where p-type layer has been formed) of the specimen annealed at 620° C., the Cu concentration [Cu] is $3.8 \times 10^{20}$ cm$^{-3}$, the Ga concentration [Ga] is $4.1 \times 10^{20}$ cm$^{-3}$, and both are approximately constant through the thickness of the p-type layer. The value of [Cu]/[Ga] value is 0.93.

In the position corresponding to the position where the alternate laminate structure had been formed of the specimen annealed at 630° C., the Cu concentration [Cu] is $4.2 \times 10^{20}$ cm$^{-3}$, the Ga concentration [Ga] is $4.8 \times 10^{20}$ cm$^{-3}$, and the value of [Cu]/[Ga] value is 0.88.

The value of [Cu]/[Ga] changes before and after the annealing, for example, by the diffusion of the Cu and Ga to the exterior of the alternate laminate structure. Compared to Ga, Cu is more likely to be diffused, and the value of [Cu]/[Ga] after the annealing would be smaller than the value before the annealing. The value of [Cu]/[Ga] after the annealing varies by the temperature used in the annealing, and [Cu]/[Ga] is likely to decrease with the increase in the annealing temperature. The [Cu]/[Ga] will also change by other conditions of the annealing such as annealing time.

Figure 8:
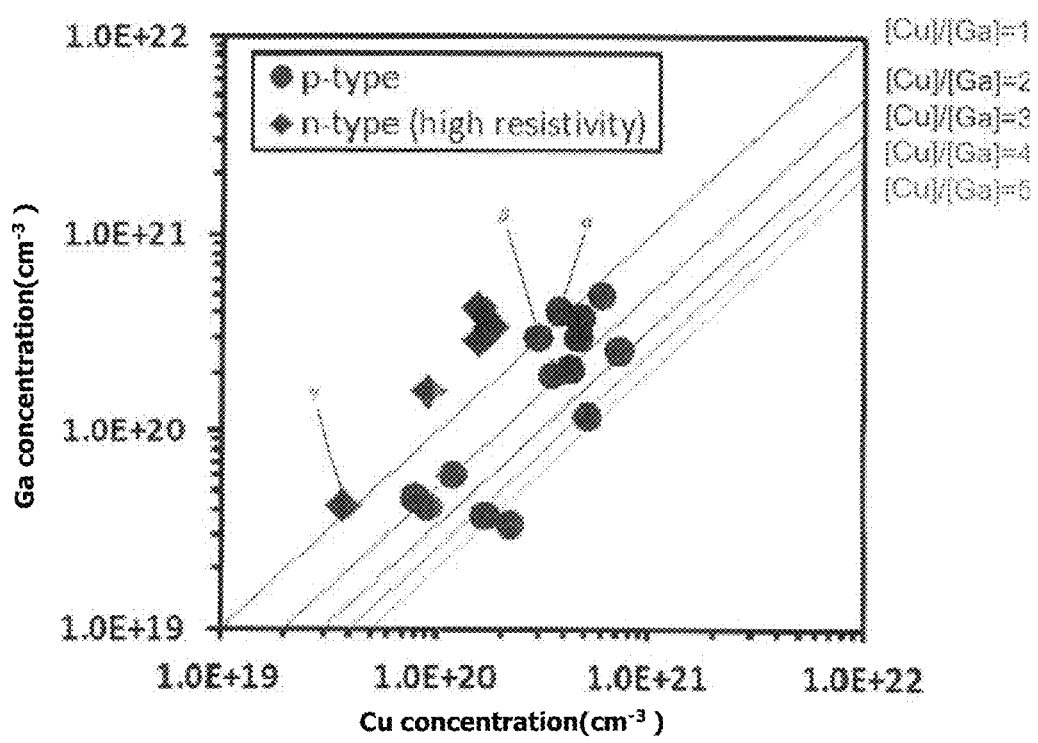
FIG. 8 shows graphs of electroconductivity, Cu concentration [Cu], Ga concentration [Ga], and [Cu]/[Ga] value of the annealed alternate laminate structure or its corresponding position.

FIG. 8 is a graph showing electroconductivity, Cu concentration [Cu], Ga concentration [Ga], and [Cu]/[Ga] value of the position corresponding to the annealed alternate laminate structure, and this graph includes not only Samples 1 to 5 but also other experimental samples conducted by the inventors of the present invention. In the graph, the x axis represents Cu concentration [Cu] by the unit "cm$^{-3}$" and the y axis represents Ga concentration [Ga] by the unit "cm$^{-3}$". Both axes are in logarithmic scale. Solid (black) circles represent samples which became p-type after the annealing and solid diamonds represent samples which failed to be p-type despite increase in its resistance.

The sample indicated by a is the sample which became p-type at the value of the [Cu]/[Ga] of 0.93 (Sample 5 annealed at 620° C.). For this sample represented by a, the Cu concentration [Cu] is $3.8 \times 10^{20}$ cm$^{-3}$, and the Ga concentration [Ga] is $4.1 \times 10^{20}$ cm$^{-3}$.

The sample indicated by β is the sample which became p-type at the value of the [Cu]/[Ga] of 1.0. For this sample represented by β, both the Cu concentration [Cu] and the Ga concentration [Ga] are $3.0 \times 10^{20}$ cm$^{-3}$.

The sample indicated by γ is the sample which failed to become p-type at the value of [Cu]/[Ga] of 0.93. For this sample represented by γ, the Cu concentration [Cu] is $3.8 \times 10^{19}$ cm$^{-3}$, and the Ga concentration [Ga] is $4.1 \times 10^{19}$ cm$^{-3}$.

Samples α and γ are different in their Cu concentration [Cu] and Ga concentration [Ga] by one order of magnitude, and comparison of these samples indicate that even if the value of [Cu]/[Ga] value were equal (0.93), conversion into the p-type depends on the absolute values of the concentration ([Cu] and [Ga]).

Although not plotted in the graph, a sample with p-type was obtained at the Cu concentration [Cu] of $5.87 \times 10^{20}$ cm$^{-3}$, the Ga concentration [Ga] of $6.44 \times 10^{20}$ cm$^{-3}$, and the [Cu]/[Ga] value of 0.91. Conversion to the p-type seems to be possible at the [Cu]/[Ga] value of 0.90 or higher.

The experiments as described above conducted by the inventors of the present invention demonstrate that the alternate laminate structure (Ga-doped ZnO single crystal film) of Samples 1 to 5 is n-type in its as-grown state (see FIGS. 3 and 6), and when annealed, it is converted to p-type (see lower column of FIG. 4 and FIG. 6) after experiencing increase in the resistance (see upper column of FIG. 4). As a result of the annealing, Cu in the Cu layer evenly diffuses in the interior of the Ga-doped ZnO single crystal film, and conceivably, this Cu diffusion (generation of Cu$^+$ functioning as an acceptor) results in the increase of the resistance (decrease of the donor concentration $N_d$) of the alternate laminate structure (Ga-doped ZnO single crystal film), and hence, generation of the p-type ZnO single crystal layer co-doped with Cu ad Ga.

Comparison of Samples 1 to 5 indicates that conditions in the annealing required for conversion into the p-type (for example, temperature, time, and atmosphere) are likely to be different by the thickness of the alternate laminate structure and the Ga-doped ZnO single crystal, the Cu concentration [Cu], the Ga concentration [Ga], and the ratio of [Cu] to [Ga] ([Cu]/[Ga]) of the alternate laminate structure, and the like.

With regard to the value of [Cu]/[Ga] in Samples 1 to 3 wherein the Cu concentration [Cu] and the Ga concentration [Ga] are respectively within narrow ranges, the value of [Cu]/[Ga] is in the relation: Sample 1>Sample 2>Sample 3, and temperature or time of the annealing required for conversion to p-type decreases with the decrease in the [Cu]/[Ga] value. The value of [Cu]/[Ga] is, for example, preferably less than 100, and more preferably up to 50 in consideration of the risk of, for example, formation of donor-type point defect such as oxygen vacancy by high temperature annealing, decrease in the Cu concentration and the Ga concentration in the p-type layer associated with diffusion of Cu and Ga to the exterior of the p-type layer, and loss of steepness at the p-n interface associated with the diffusion of the Cu and the Ga to the underlying layer (n-type layer).

In addition, if it is conceived that Cu and Ga are compensated at Cu:Ga of 1:1 in the alternate laminate structure (the structure comprising the Ga-doped ZnO single crystal film and the Cu supplied on the film surface), conversion to p-type should be possible when [Cu]/[Ga]>1. The experiments, however, demonstrated that, if Cu and Ga are supplied during the formation of the alternate laminate structure so that the value of [Cu]/[Ga] at the position corresponding to the alternate laminate structure after the annealing is 0.9 or higher, the alternate laminate structure can be converted to p-type. The p-type electroconductivity of practical level is more likely to be obtained, for example, when the [Cu]/[Ga]≥2.

Accordingly, when the value of [Cu]/[Ga] at the position corresponding to the alternate laminate structure after the annealing is 0.9 [Cu]/[Ga]<100, the alternate laminate structure can be converted to the p-type by annealing at a relatively low temperature, and when the value is 2≤[Cu]/[Ga]≤50, the p-type electroconductivity of practical level may be realized by annealing at an even lower temperature.

In the experiment, a p-type layer having a approximately constant Cu concentration [Cu] and a approximately constant Ga concentration [Ga] through the thickness was obtained as shown, for example, in FIG. 5. The Cu concentration [Cu] in the p-type layer was $1.2 \times 10^{20}$ cm$^{-3}$ (in the case of Sample 3) to $4.8 \times 10^{20}$ cm$^{-3}$ (in the case of Sample 5 annealed at 600° C.).

These results indicate that, Cu can be evenly doped in the thickness direction at least to a concentration of less than $1.0 \times 10^{21}$ cm$^{-3}$ so that the Cu will be at a concentration high enough, namely, at $1.0 \times 10^{19}$ cm$^{-3}$ or higher, for example, by the method of annealing the Ga-doped n-type ZnO single crystal film having Cu supplied on the film surface.

The inventors of the present invention has found after an intensive study that, in the ZnO based compound semiconductor layer, Cu impurity concentration (acceptor concentration) is about 2 orders of magnitude lower than Cu absolute concentration [Cu]. In consideration of this finding, a p-type layer having an acceptor concentration of at least $1.0 \times 10^{17}$ cm$^{-3}$ and less than $1.0 \times 10^{19}$ cm$^{-3}$ can be produced by the method of annealing the Ga-doped n-type ZnO single crystal film having Cu supplied on the film surface. In fact, the depth profile shown in the lower column of FIGS. 4 and 6 demonstrate that the acceptor concentration $N_a$ of Samples 1 to 5 is $1.0 \times 10^{17}$ cm$^{-3}$ (in the case of Sample 2) to $1.0 \times 10^{19}$ cm$^{-3}$ (in the case of Samples 1, 3, and 4).

A p-type layer can be deemed practical when the acceptor concentration is at least $1.0 \times 10^{17}$ cm$^{-3}$. Accordingly, the p-type layer obtained in the experiment is a p-type ZnO based compound semiconductor single crystal layer having the p-type electroconductivity of practical level.

The method of annealing the Ga-doped ZnO single crystal film having Cu supplied on the film surface is capable of producing a Cu and Ga co-doped ZnO single crystal layer which has Cu evenly doped at a high concentration through the thickness of the layer and which has p-type electroconductivity of practical level. This method has also enabled the production by annealing at a low temperature.

The alternate laminate structure (Ga-doped ZnO single crystal film having Cu supplied on the film surface) exhibiting n-type electroconductivity is converted to p-type electroconductivity by annealing after increase in the resistance. For example, in the case of Sample 1, the specimen is converted to p-type, by conducing annealing at 650° C. for 30 minutes to prepare a specimen exhibiting a high resistance (see graphs in the upper row of FIG. 4), namely, by conducing visualized step of increasing the resistance, and then conducting further annealing for 40 minutes to thereby accomplish the conversion to the p-type (see graphs in the lower row of FIG. 4). However, the alternate laminate structure is also converted to p-type when the pre-annealing specimen is subjected continuous annealing at 650° C. for 70 minutes, and in this process, the alternate laminate structure may be deemed to have undergone latent increase in the resistance before the conversion to the p-type. Similarly, the alternate laminate structure could be converted to the p-type through latent increase in the resistance by annealing in the atmosphere, for example, by annealing the pre-annealing specimen of Sample 2 at 650° C. for 30 minutes, the pre-annealing specimen of Sample 3 at 590° C. for 12 minutes, or the pre-annealing specimen of Sample 4 at 600° C. for 50 minutes.

However, it is also possible to consider that the alternate laminate structure is converted to the p-type not only through the latent or visualized increase in the resistance but also through the subsequent insulation, and the process of insulation may be made visualized by selecting an appropriate annealing condition. Accordingly, the conversion to the p-type of the alternate laminate structure may be described as a process through the latent or visualized increase in the resistance and the subsequent latent or visualized insulation process.

The inventors of the present invention found that the alternate laminate structure reconverted into p-type can again be imparted with n-type electroconductivity by further annealing. Accordingly, the annealing may be finished after the process of increase in the resistance and the conversion into p-type and before the returning to the n-type layer.

The first experiment conducted by the inventors of the present invention demonstrated that annealing of the Ga-doped ZnO single crystal film having Cu supplied on the film surface (the alternate laminate structure prepared by alternately repeating the step of forming the Ga-doped ZnO single crystal film and the Cu attaching step) results in the increase of the resistance and subsequent formation of the p-type ZnO layer co-doped with Cu and Ga. Next, Example 1 wherein a ZnO based compound semiconductor light emitting element is produced by using the Cu and Ga co-doped ZnO layer for the p-type semiconductor layer is described.

Figure 9A:
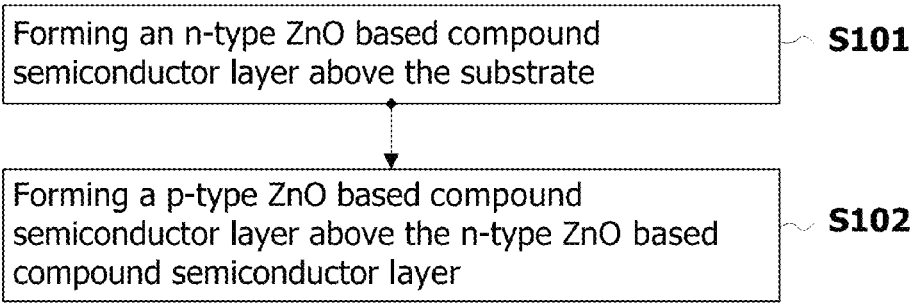
FIGS. 9A, 9B, and 9D are schematic flow charts showing production method of the ZnO based compound semiconductor light emitting element in the Examples.
Figure 9B:
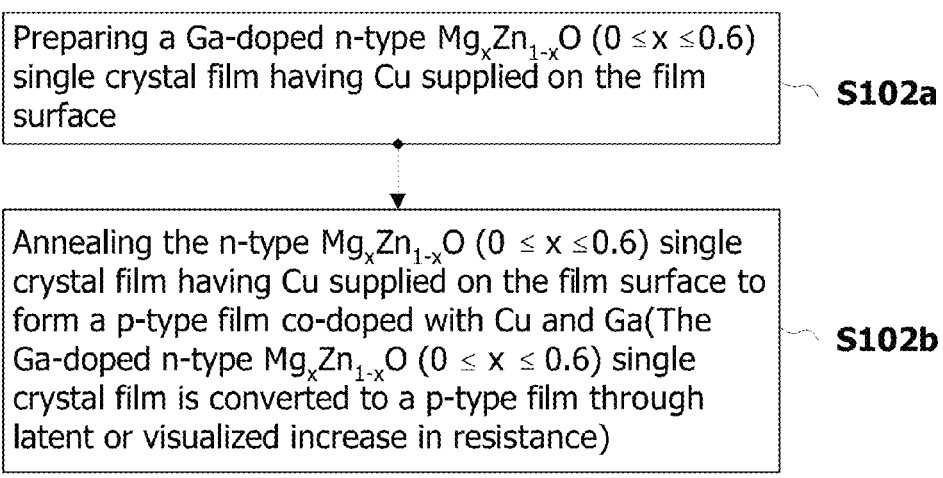

FIGS. 9A and 9B are schematic flow charts showing production method of the ZnO based compound semiconductor light emitting element in the Example 1. It is to be noted that the present invention can be applied not only to the light-emitting elements but also to a wide range of semiconductor elements while the light-emitting elements are described in the Examples.

As shown in FIG. 9A, the production method of the ZnO based compound semiconductor light emitting element of Example 1 comprises the steps of forming an n-type ZnO based compound semiconductor layer above a substrate (step S101), and the step of forming a p-type ZnO based compound semiconductor layer above the n-type ZnO based compound semiconductor layer formed in step S101 (step S102).

In addition, as shown in FIG. 9B, the step of forming a p-type ZnO based compound semiconductor layer of step S102 comprises two steps, namely, step S102a and step S102b.

In the step of forming a p-type ZnO based compound semiconductor layer (step S102), a Ga-doped n-type $Mg_xZn_{1-x}O$ (0≤x≤0.6) single crystal film having Cu supplied on the film surface is first prepared (step S102a). In an exemplary such preparation, a Ga-doped n-type $Mg_xZn_{1-x}O$ (0≤x≤0.6) single crystal film is formed, and Cu is then supplied on the film surface.

Next, the Ga-doped n-type $Mg_xZn_{1-x}O$ single crystal film prepared in step S102a is annealed to form a p-type film co-doped with Cu and Ga (step S102b). By this annealing, the Ga-doped n-type $Mg_xZn_{1-x}O$ single crystal film is converted to p-type through latent or visualized increase of the resistance.

Figure 9C:
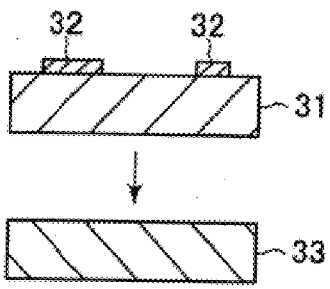
FIG. 9C is a schematic cross sectional view of the semiconductor layer illustrating the formation of the p-type ZnO based compound semiconductor layer.

FIG. 9C is schematic cross sectional views of the semiconductor layer illustrating the formation of the p-type ZnO based compound semiconductor layer (step S102). In step S102a, the Ga-doped n-type $Mg_xZn_{1-x}O$ (0≤x≤0.6) single crystal film 31 having Cu 32 supplied on the film surface is prepared. In step S102b, the Ga-doped n-type $Mg_xZn_{1-x}O$ single crystal film 31 having the Cu 32 attached thereto is annealed. This annealing facilitates diffusion of the Cu 32 in the Ga-doped n-type $Mg_xZn_{1-x}O$ single crystal film 31, and Cu and Ga co-doped p-type $Mg_xZn_{1-x}O$ (0≤x≤0.6) single crystal film 33 is thereby formed. The formation of the Cu and Ga co-doped p-type $Mg_xZn_{1-x}O$ single crystal film 33 is associated with the preceding increase in resistance of the Ga-doped n-type $Mg_xZn_{1-x}O$ single crystal film 31 caused by diffusion of the Cu 32. More specifically, annealing conditions may be adequately selected to directly convert the Ga-doped n-type $Mg_xZn_{1-x}O$ single crystal film 31 having the Cu 32 supplied on the film surface to the p-type $Mg_xZn_{1-x}O$ single crystal film 33 (conversion to p-type layer through latent increase in the resistance), or alternatively, to first form the Cu and Ga co-doped n-type $Mg_xZn_{1-x}O$ ($0 \leq x \leq 0.6$) single crystal film having a resistance higher than that of the Ga-doped n-type $Mg_xZn_{1-x}O$ single crystal film 31, and then conduct the further annealing to thereby form the Cu and Ga co-doped p-type $Mg_xZn_{1-x}O$ single crystal film 33 (conversion to p-type layer through visualized increase in the resistance).

It is to be noted that the conversion into p-type of the Ga-doped n-type $Mg_xZn_{1-x}O$ single crystal film 31 may be considered as a process through the steps of increase in the resistance, insulation, and conversion into the p-type. When understood in this way, this process may be conceived that, in step S102b, the Ga-doped n-type $Mg_xZn_{1-x}O$ single crystal film 31 is first converted to exhibit higher resistance in latent or visualized way, and then insulated in latent or visualized way to subsequently exhibit p-type electroconductivity.

Figure 9D:
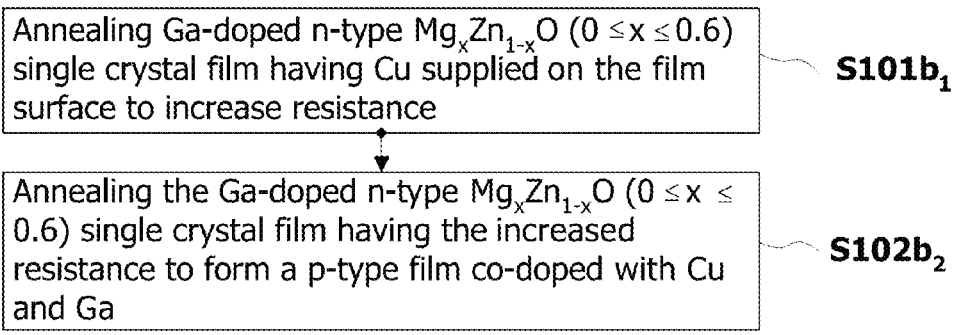

As shown FIG. 9D, Step S102b may also be described as a process comprising the step of annealing the Ga-doped n-type $Mg_xZn_{1-x}O$ ($0 \leq x \leq 0.6$) single crystal film having Cu supplied on the film surface to increase its resistance (step S102$b_1$) and the step of annealing Ga-doped n-type $Mg_xZn_{1-x}O$ ($0 \leq x \leq 0.6$) single crystal film whose resistance has been increased in step S102$b_1$ to form a p-type film co-doped with Cu and Ga (step S102$b_2$).

Figure 10:
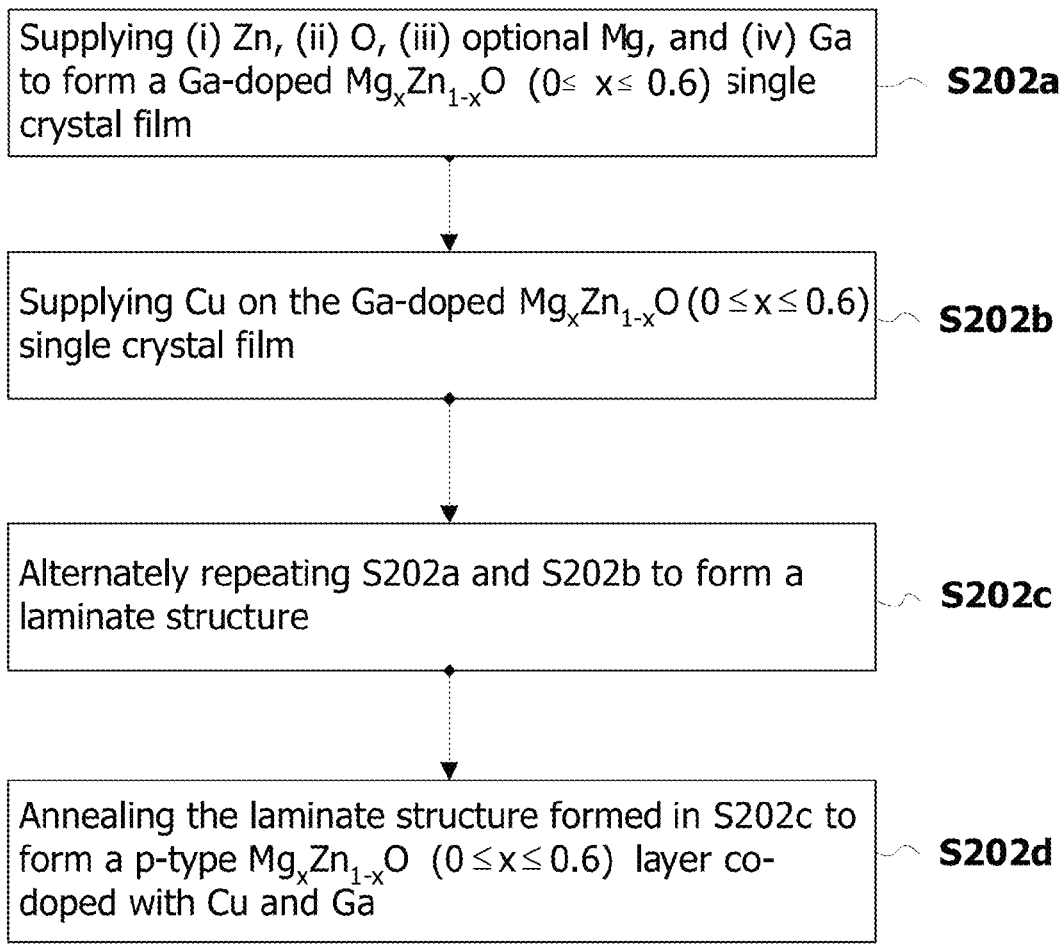
FIG. 10 is a flow chart showing a production method of the ZnO based compound semiconductor light emitting element by Example 1 from another point of view.

FIG. 10 is a flow chart showing a production method of the ZnO based compound semiconductor light emitting element by Example 1 from another point of view. In this flow chart, step S102 in FIG. 9A, namely, the step of forming the p-type ZnO based compound semiconductor layer comprises 4 steps of step S202a, step S202b, step S202c, and step S202d.

In the step of forming the p-type ZnO based compound semiconductor layer (step S102), Zn, O, optional Mg, and Ga are supplied to form the Ga-doped n-type $Mg_xZn_{1-x}O$ ($0 \leq x \leq 0.6$) single crystal film (step S202a). Next, Cu is supplied on the Ga-doped n-type $Mg_xZn_{1-x}O$ ($0 \leq x \leq 0.6$) single crystal film formed in step S202a (step S202b). Step S202a and step S202b are alternately repeated to form the laminate structure (step S202c), and then, the laminate structure formed in step S202c is annealed to form the p-type $Mg_xZn_{1-x}O$ ($0 \leq x \leq 0.6$) layer doped with Cu and Ga (step S202d).

It is to be noted that the n-type ZnO based compound semiconductor laminate structure by Example 1 is prepared by steps S202a to step S202c.

Next, Examples 2 to 4 are described. Examples 2 to 4 are application of Example 1.

Figure 11A:
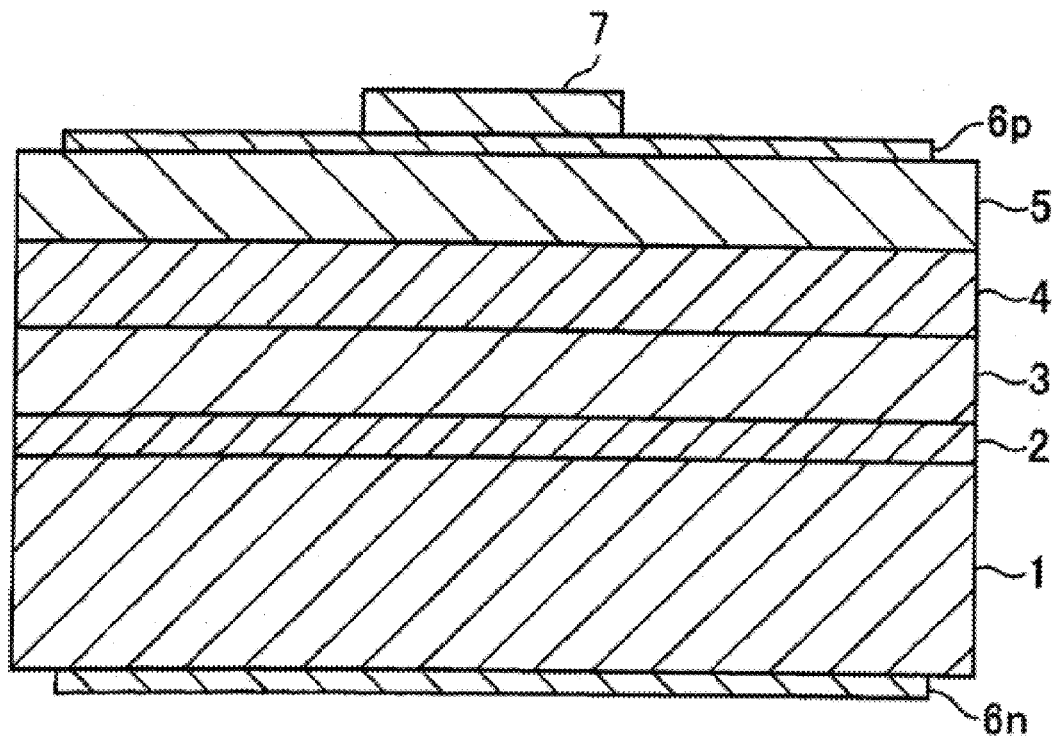
FIG. 11A is a schematic cross sectional view of the ZnO based compound semiconductor light emitting element produced by the production method of Example 2.
Figure 11B:
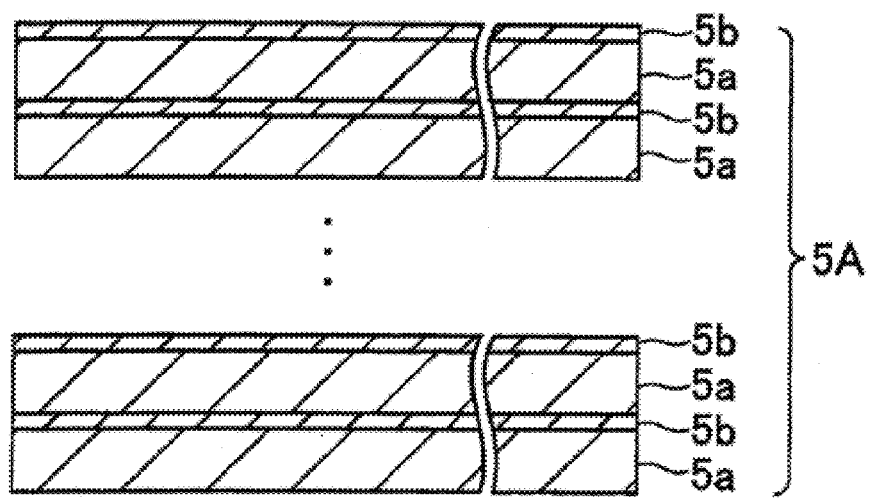
FIG. 11B is a schematic cross sectional view of the alternate laminate structure 5A.

Production of a ZnO based compound semiconductor light emitting element having a homo-structure of Example 2 is described by referring FIGS. 11A and 11B. FIG. 11A is a schematic cross sectional view of the ZnO based compound semiconductor light emitting element produced by the production method of Example 2.

A ZnO buffer layer 2 having a thickness of 30 nm was formed on a ZnO substrate 1 at a growth temperature of 300° C. by using a Zn flux $F_{Zn}$ of 0.15 nm/s ($J_{Zn}=9.9\times10^{14}$ atoms/$cm^2$s) and irradiating O radical beam at an RF power of 300 W and a $O_2$ flow rate of 2.0 sccm ($J_O=8.1\times10^{14}$ atoms/$cm^2$s). The ZnO buffer layer 2 was annealed at 900° C. for 10 minutes for improving crystallinity and surface evenness of the ZnO buffer layer 2.

Zn, O, and Ga were simultaneously supplied on the ZnO buffer layer 2 at a growth temperature of 900° C. to form an n-type ZnO layer 3 having a thickness of 150 nm (for example, step S101 in FIG. 9A). Zn was supplied at a Zn flux $F_{Zn}$ of 0.15 nm/s ($J_{Zn}=9.9\times10^{14}$ atoms/$cm^2$s), and the O radical beam was irradiated at an RF power of 250 W and an $O_2$ flow rate of 1.0 sccm ($J_O=4.0\times10^{14}$ atoms/$cm^2$s), and Ga cell temperature was 460° C. The n-type ZnO layer 3 had a Ga concentration of, for example, $1.5\times10^{18}$ $cm^{-3}$.

An undoped ZnO active layer 4 having a thickness of 15 nm was deposited on the n-type ZnO layer 3 at a growth temperature of 900° C. and a Zn flux $F_{Zn}$ of 0.03 nm/s ($J_{Zn}=2.0\times10^{14}$ atoms/$cm^2$s). The O radical beam was irradiated at an RF power of 300 W and an $O_2$ flow rate of 2.0 sccm ($J_O=8.1\times10^{14}$ atoms/$cm^2$s).

Subsequently, a Cu and Ga co-doped p-type ZnO layer 5 was formed on the undoped ZnO active layer 4 (Step S102 in FIG. 9A).

First, substrate temperature was set to 300° C., and Ga-doped n-type ZnO single crystal film having Cu supplied on the surface was prepared by supplying Zn, O and Ga at a timing different from Cu at the same shutter sequence as the pre-annealing specimen of Sample 1 (see FIG. 2B). More specifically, each of the step of depositing a Ga-doped ZnO single crystal film by supplying Zn, O, and Ga and the step of supplying Cu on the Ga-doped ZnO single crystal film were alternately repeated for 140 times to form an alternate laminate structure having a thickness of 480 nm. In other words, the alternate laminate structure may be regarded as a laminate of 140 Ga-doped n-type ZnO single crystal films each supplied with Cu on its surface disposed one on another in thickness direction.

Each growth period for Ga-doped ZnO single crystal film was set at 16 seconds, and each Cu supplying period was 10 seconds. The Ga-doped ZnO single crystal film was deposited by using a Zn flux $F_{Zn}$ of 0.17 nm/s ($J_{Zn}=1.1\times10^{15}$ atoms/$cm^2$s), and irradiating the O radical beam at an RF power of 300 W and an $O_2$ flow rate of 2.0 sccm ($J_O=8.1\times10^{14}$ atoms/$cm^2$s), and the Ga cell temperature $T_{Ga}$ was 490° C. The VI/II flux ratio was 0.74. The cell temperature in the Cu supplying step $T_{Cu}$ was 930° C., and the Cu flux $F_{Cu}$ was 0.0015 nm/s.

FIG. 11B is a schematic cross sectional view of the alternate laminate structure 5A. The alternate laminate structure 5A has a structure wherein a Ga-doped ZnO single crystal films 5a and a Cu layers 5b are alternately laminated one on another (a structure wherein the Ga-doped ZnO single crystal films 5a having Cu supplied on the film surface are disposed one on another in thickness direction). The Ga-doped ZnO single crystal film 5a has a thickness of approximately 3.3 nm, and the Cu layer 5b has a thickness of up to 1 atomic layer, for example, about 1/20 atomic layer (so that approximately 5% of the surface of the Ga-doped ZnO single crystal film 5a is covered with Cu). The alternate laminate structure 5A (the Ga-doped ZnO single crystal film 5a having Cu supplied on the film) has n-type electroconductivity, and donor concentration $N_d$ is, for example, about $1.0\times10^{20}$ $cm^{-3}$.

Next, the Ga-doped ZnO single crystal film having Cu supplied on the film surface 5a (alternate laminate structure 5A) was annealed to form the Cu-doped p-type film (Cu and Ga co-doped p-type ZnO layer 5). For example, annealing may be conducted in the atmosphere at 650° C. for 70 minutes to diffuse Cu of the Cu layer 5b into the Ga-doped ZnO single crystal film 5a to convert the alternate laminate structure 5A exhibiting n-type electroconductivity to the one exhibiting p-type. Under such annealing conditions, the Ga-doped ZnO single crystal film 5a is converted to the one exhibiting p-type through latent increase in the resistance.

Alternatively, the annealing may be conducted in the atmosphere at 650° C. for 30 minutes to form a Ga-doped ZnO single crystal film 5a having a visually increased resistance, and then conducting additional annealing in the atmosphere at 650° C. for 40 minutes to thereby form the Ga-doped ZnO single crystal film 5a exhibiting p-type electroconductivity.

An n electrode 6n was subsequently formed on the rear surface of the ZnO substrate 1. A p electrode 6p was formed on the Cu and Ga co-doped p-type ZnO layer 5, and a bonding electrode 7 was formed on the p electrode 6p. The n electrode 6n may be formed by depositing an Au layer having a thickness of 500 nm on a Ti layer having a thickness 10 nm. The p electrode 6p was formed by depositing a Au layer having a thickness of 10 nm on a Ni layer having a size of 300 μm square and a thickness of 1 nm, and the bonding electrode 7 was formed by depositing a Au layer having a size of 100 μm square and a thickness of 500 nm. The ZnO based compound semiconductor light emitting element was thereby formed by the method of Example 2.

FIG. 11A is a schematic cross sectional view of the ZnO based compound semiconductor light emitting element produced by the production method of Example 2. The ZnO based compound semiconductor light emitting element of Example 2 comprises an n-type ZnO based compound semiconductor layer (the n-type ZnO layer 3), a ZnO based compound semiconductor active layer formed above the n-type ZnO based compound semiconductor layer (the undoped ZnO active layer 4), a p-type ZnO based compound semiconductor layer formed above the ZnO based compound semiconductor active layer (the Cu and Ga co-doped p-type ZnO layer 5), an n electrode electrically connected to the n-type ZnO based compound semiconductor layer (the n electrode 6n), and a p electrode electrically connected to the p-type ZnO based compound semiconductor layer (the p electrode 6p).

The Cu and Ga co-doped p-type ZnO layer 5 is a p-type ZnO single crystal layer co-doped with Cu and Ga. In the Cu and Ga co-doped p-type ZnO layer 5, the Cu concentration [Cu] is at least $1.0 \times 10^{19}$ cm$^{-3}$ and less than $1.0 \times 10^{21}$ cm$^{-3}$, and for example, $2.2 \times 10^{20}$ cm$^{-3}$, and the [Cu] is approximately constant in thickness direction. The Ga concentration [Ga] is for example, $3.4 \times 10^{19}$ cm$^{-3}$, and [Ga] is approximately constant in thickness direction. The Cu concentration [Cu] and the Ga concentration [Ga] are in the relation: 0.9 ≤ [Cu]/[Ga]<100, and preferably 2≤[Cu]/[Ga]≤50. In the Cu and Ga co-doped p-type ZnO layer 5 of Example 2, [Cu]/[Ga] is 6.5. The Cu and Ga co-doped p-type ZnO layer 5 of the semiconductor light emitting element of Example 2 is a p-type ZnO layer having a high Cu concentration which is evenly doped through its thickness.

The production method of Example 2 is capable of producing a Cu and Ga co-doped ZnO single crystal layer which has Cu evenly doped at a high concentration through the thickness of the layer and which has p-type electroconductivity of practical level. This method has also enabled the production by annealing at a low temperature.

In the first experiment and Example 2, the layer formed was the Cu and Ga co-doped p-type ZnO layer. A Cu-doped p-type film (Cu and Ga co-doped p-type $Mg_xZn_{1-x}O$ (0<x≤0.6) single crystal film) may also be produced by annealing a Ga-doped n-type $Mg_xZn_{1-x}O$ (0<x≤0.6) single crystal film having Cu supplied on the film surface.

Figure 12:
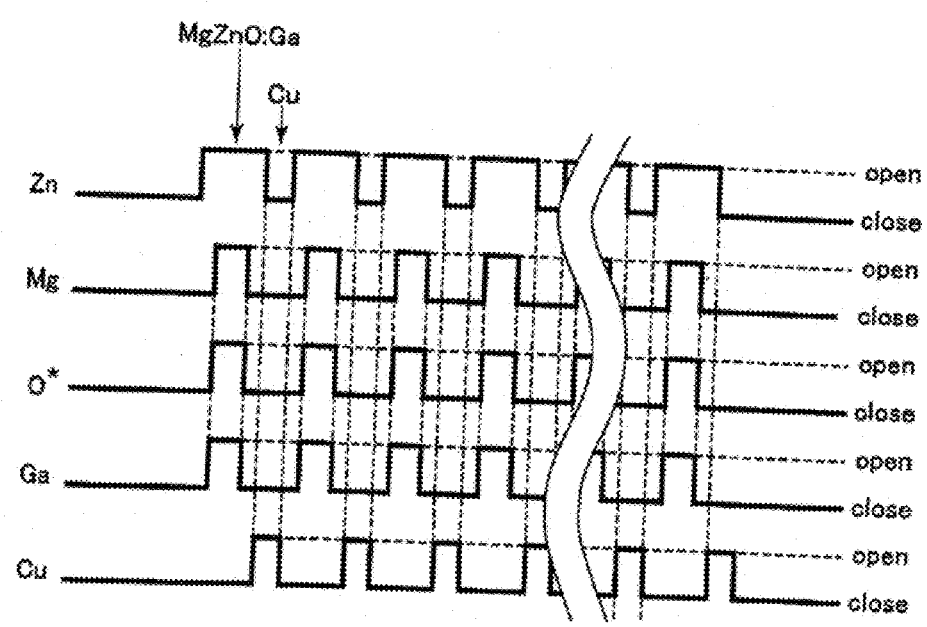
FIG. 12 is a time chart of an exemplary shutter sequence of Zn cell, Mg cell, O cell, Ga cell, and Cu cell during formation of the alternate laminate structure.

An exemplary preparation of a Ga-doped n-type $Mg_xZn_{1-x}O$ (0<x≤0.6) single crystal film having Cu supplied on the film surface is explained by referring to FIG. 12. The film prepared is an alternate laminate structure comprising alternately deposited Ga-doped n-type $Mg_xZn_{1-x}O$ (0<x≤0.6) single crystal film and Cu layer.

FIG. 12 is a time chart of an exemplary shutter sequence of the Zn cell, the Mg cell, the O cell, the Ga cell, and the Cu cell during formation of the alternate laminate structure.

In the formation of the alternate laminate structure, the step of depositing the Ga-doped $Mg_xZn_{1-x}O$ (0<x≤0.6) single crystal film conducted by opening the Zn cell shutter, the Mg cell shutter, the O cell shutter, and the Ga cell shutter while closing the Cu cell shutter, and the Cu attaching step conducted by closing the Zn cell shutter, the Mg cell shutter, the O cell shutter, and the Ga cell shutter while opening the Cu cell shutter are alternately repeated.

In the case shown in FIG. 12, the step of forming the Ga-doped $Mg_xZn_{1-x}O$ single crystal film is designed so that the period when Zn cell shutter is open include the period when the Mg cell shutter, the O cell shutter, and the Ga cell shutter are open. More specifically, opening and closing of the Mg cell shutter, the O cell shutter, and the Ga cell shutter are simultaneously conducted while the Zn cell shutter is opened before the opening of the Mg cell shutter, the O cell shutter, and the Ga cell shutter and closed after the closing of the Mg cell shutter, the O cell shutter, and the Ga cell shutter.

For example, each open period of the Mg cell shutter, the O cell shutter, and the Ga cell shutter is 16 seconds. The Zn cell shutter is opened and closed 1 second before and after the open period of the Mg cell shutter, the O cell shutter, and the Ga cell shutter, and therefore, each open period of the Zn cell shutter is 18 seconds. The 16 seconds when all of the Zn cell shutter, the Mg cell shutter, the O cell shutter, and the Ga cell shutter is each growth period of the Ga-doped $Mg_xZn_{1-x}O$ single crystal film. Each open period of the Cu cell shutter was 10 seconds.

Since simultaneous supplying of the O radical and the Cu is avoided and the surface of the Ga-doped $Mg_xZn_{1-x}O$ single crystal film is covered with Zn before and after the Cu attachment step, direct reaction between the O radical and the Cu is suppressed.

When Mg is supplied with Zn, at least one of the open period of the Zn cell shutter and the open period of the Mg cell shutter preferably includes the open period of the O cell shutter in view of suppressing the reaction the O radical and the Cu. In addition, in view of controlling Mg composition in the Ga-doped $Mg_xZn_{1-x}O$ single crystal film, the open period of the Zn cell shutter should preferably include the open period of the Mg cell shutter and O cell shutter.

Annealing of the Ga-doped n-type $Mg_xZn_{1-x}O$ (0<x≤0.6) single crystal film having the Cu supplied on the film surface (the alternate laminate structure) results in the increase of the resistance, and then, in the production of the Cu and Ga co-doped p-type $Mg_xZn_{1-x}O$ (0<x≤0.6) single crystal film.

Next, a ZnO based compound semiconductor light emitting element with a double heterostructure having a Cu and Ga co-doped p-type $Mg_xZn_{1-x}O$ (0<x≤0.6) single crystal layer is described by referring to Examples 3 and 4.

Figure 13A:
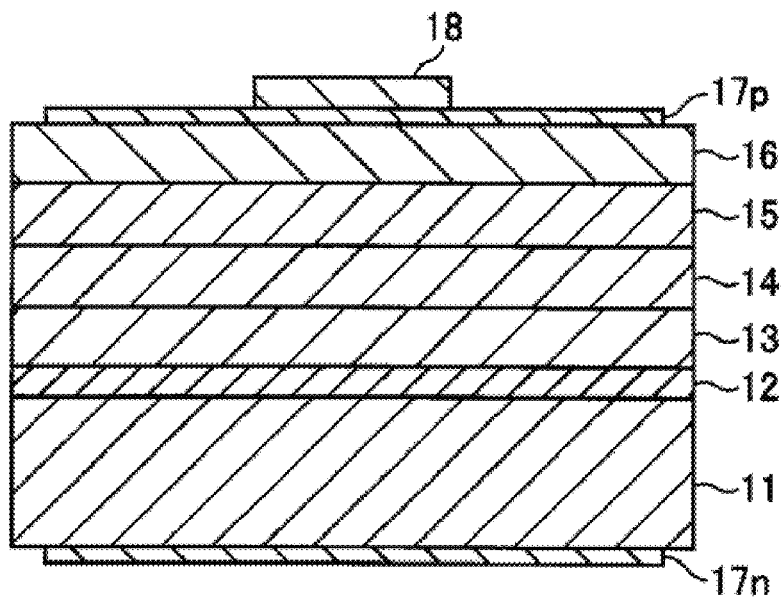
FIG. 13A is a schematic cross sectional view of the ZnO based compound semiconductor light emitting element produced by the production method of Example 3.

FIG. 13A is a schematic cross sectional view of the ZnO based compound semiconductor light emitting element produced by the production method of Example 3.

Zn and O were simultaneously supplied on the surface of the ZnO substrate 11 to deposit a ZnO buffer layer 12 having a thickness of, for example, 30 nm. Exemplary conditions used in depositing the ZnO buffer layer 12 include a growth temperature of 300° C., a Zn flux $F_{Zn}$ of 0.15 nm/s, and the O radical beam irradiation at an RF power 300 W and an $O_2$ flow rate of 2.0 sccm. Annealing at 900° C. for 10 minutes was conducted to improve crystallinity and surface evenness of the ZnO buffer layer 12.

Zn, O, and Ga were simultaneously supplied on the surface of the ZnO buffer layer 12 to deposit an n-type ZnO layer 13 having a thickness of 150 nm, for example, at a temperature of 900° C. The Zn flux $F_{Zn}$ was 0.15 nm/s and the O radical beam was irradiated at an RF power of 250 W and an $O_2$ flow rate of 1.0 sccm, and Ga cell temperature was 460° C. The n-type ZnO layer 13 had a Ga concentration of, for example, $1.5 \times 10^{18}$ cm$^{-3}$.

Zn, Mg, and O were simultaneously supplied on the surface of the n-type ZnO layer 13 to deposit an n-type MgZnO layer 14 having a thickness of, for example, 30 nm. Exemplary conditions used in the deposition include a temperature of 900° C., a Zn flux $F_{Zn}$ of 0.1 nm/s, a Mg flux $F_{Mg}$ of 0.025 nm/s, and the O radical beam irradiation at an RF power of 300 W and an $O_2$ flow rate of 2.0 sccm. The Mg composition of the n-type MgZnO layer 14 is, for example, 0.3.

Zn and O were simultaneously supplied on the surface of the on the n-type MgZnO layer 14 to deposit a ZnO active layer 15 having a thickness 10 nm at a temperature of 900° C. The Zn flux $F_{Zn}$ was 0.1 nm/s, and the O radical beam was irradiated at an RF power of 300 W and an $O_2$ flow rate of 2.0 sccm.

Figure 13B:
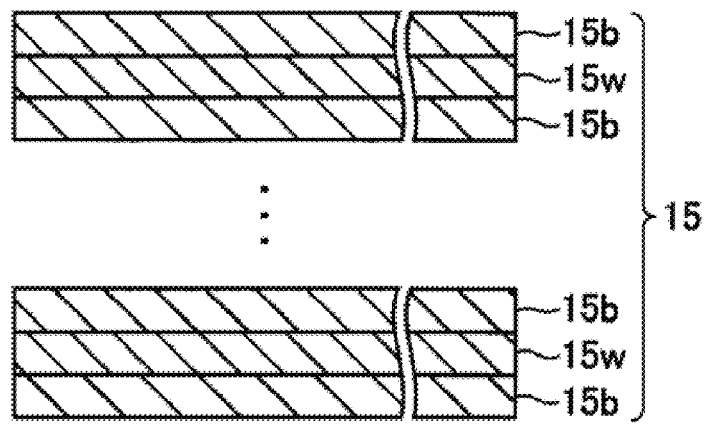
FIG. 13B is a schematic cross sectional view of another embodiment of active layer 15.

As shown in FIG. 13B, the active layer 15 may comprise a quantum well structure formed by alternately depositing a MgZnO barrier layer 15b and a ZnO well layer 15w one on another instead of the single layer ZnO layer.

An alternate laminate structure was formed on the active layer 15 by reducing the substrate temperature, for example, to 300° C. and alternately repeating the step of depositing the Ga-doped MgZnO single crystal film and the Cu attachment step (Ga-doped n-type MgZnO single crystal film having Cu supplied on the film surface was prepared). The shutter sequence of the Zn cell, the Mg cell, the O cell, the Ga the cell, and Cu cell used in forming the alternate laminate structure may be, for example, the same as the one shown in FIG. 12.

For example, each growth period in the step of depositing the Ga-doped MgZnO single crystal film was 16 seconds, and each Cu supplying period in the Cu attachment step was 10 seconds. In the step of depositing the Ga-doped MgZnO single crystal film, the Zn flux $F_{Zn}$ was 0.15 nm/s, the Mg flux $F_{Mg}$ was 0.03 nm/s, and the O radical beam was irradiated at an RF power of 300 W and an $O_2$ flow rate of 2.0 sccm, and the Ga cell temperature $T_{Ga}$ was 498° C. The VI/II flux ratio was 0.72. In the step of supplying Cu, the Cu cell temperature $T_{Cu}$ was 930° C. and the Cu flux $F_{Cu}$ was 0.0015 nm/s. Each of the step of depositing the Ga-doped MgZnO single crystal film and the Cu attachment steps were alternately repeated for 60 times to deposit an alternate laminate structure having a thickness of 200 nm. The alternate laminate structure may also be deemed as a laminate prepared by disposing 60 layers of the Ga-doped n-type MgZnO single crystal film having Cu supplied on the film surface in the thickness direction.

Figure 13C:
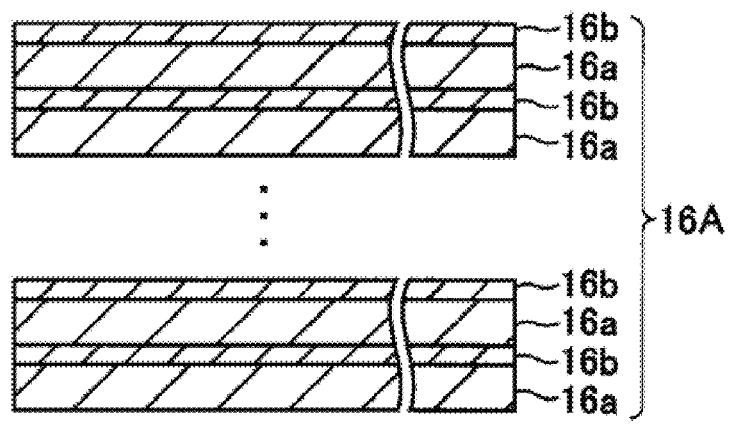
FIG. 13C is a schematic cross sectional view of the alternate laminate structure 16A.

FIG. 13C is a schematic cross sectional view of the alternate laminate structure 16A. The alternate laminate structure 16A has a structure wherein a Ga-doped MgZnO single crystal films 16a and a Cu layers 16b are alternately laminated one on another (a structure wherein the Ga-doped MgZnO single crystal films 16a having Cu supplied on the film surface are disposed one on another in thickness direction). The Ga-doped MgZnO single crystal film 16a has a thickness of approximately 3.3 nm, and the Cu layer 16b has a thickness of up to 1 atomic layer, for example, about 1/20 atomic layer (so that approximately 5% of the surface of the Ga-doped MgZnO single crystal film 16a is covered with Cu). The alternate laminate structure 16A (the Ga-doped MgZnO single crystal film 16a having Cu supplied on the film) has n-type electroconductivity, and donor concentration $N_d$ is, for example, about $7.5 \times 10^{19}$ cm$^{-3}$.

Next, a Cu-doped p-type film (the Cu and Ga co-doped p-type MgZnO layer 16) was formed on the active layer 15 by annealing the Ga-doped MgZnO single crystal film 16a having Cu supplied on the film surface (the alternate laminate structure 16A). The alternate laminate structure 16A showing n-type electroconductivity may be converted to exhibit p-type by diffusing Cu in the Cu layer 16b into the Ga-doped MgZnO single crystal film 16a by conducting the annealing, for example, in the atmosphere at 650° C. for 20 minutes. Under such annealing conditions, the Ga-doped MgZnO single crystal film 16a is converted to the one exhibiting p-type through latent increase in the resistance.

Alternatively, the Ga-doped MgZnO single crystal film 16a may be converted to exhibit p-type by conducting the annealing, for example, in the atmosphere at 650° C. for 10 minutes to visually increase resistance of the Ga-doped MgZnO single crystal film 16a, and further annealing in the atmosphere at 650° C. for 10 minutes.

Mg composition in the Cu and Ga co-doped p-type MgZnO layer 16 is, for example, 0.3.

An n electrode 17n was formed on the rear surface of the ZnO substrate 11. A p electrode 17p was formed on the Cu and Ga co-doped p-type MgZnO layer 16, and a bonding electrode 18 was formed on the p electrode 17p. The n electrode 17n may be formed, for example, by depositing an Au layer having a thickness 500 nm on a Ti layer having a thickness of 10 nm, and the p electrode 17p was formed by depositing a Au layer having a thickness of 10 nm on a Ni layer having a size of 300 μm square and a thickness of 1 nm, and the bonding electrode 18 was formed by depositing a Au layer having a size of 100 μm square to a thickness of 500 nm. The ZnO based compound semiconductor light emitting element was thereby formed by the method of Example 3.

In Example 3, the ZnO based compound semiconductor light emitting element was produced by using the ZnO substrate 11. However, the element may also be prepared by using an electroconductive substrate such as MgZnO substrate, GaN substrate, SiC substrate, and $Ga_2O_3$ substrate.

FIG. 13A is a schematic cross sectional view of the ZnO based compound semiconductor light emitting element produced by the production method of Example 3. The ZnO based compound semiconductor light emitting element of Example 3 comprises an n-type ZnO based compound semiconductor layer (for example, the n-type ZnO layer 13), an ZnO based compound semiconductor active layer formed above the n-type ZnO based compound semiconductor layer (the active layer 15), a p-type ZnO based compound semiconductor layer formed above the ZnO based compound semiconductor active layer (the Cu and Ga co-doped p-type MgZnO layer 16), an n electrode electrically connected to the n-type ZnO based compound semiconductor layer (the n electrode 17n), and p electrode electrically connected to the p-type ZnO based compound semiconductor layer (the p electrode 17p).

The Cu and Ga co-doped p-type MgZnO layer 16 is a p-type MgZnO single crystal layer co-doped with Cu and Ga. In the Cu and Ga co-doped p-type MgZnO layer 16, the Cu concentration [Cu] is at least $1.0 \times 10^{19}$ cm$^{-3}$ and less than $1.0 \times 10^{21}$ cm$^{-3}$, and for example, $2.0 \times 10^{20}$ cm$^{-3}$, and the [Cu] is approximately constant in thickness direction. The Ga concentration [Ga] is for example, $3.6 \times 10^{19}$ cm$^{-3}$, and the [Ga] is approximately constant in thickness direction. The Cu concentration [Cu] and the Ga concentration [Ga] are in the relation: 0.9 [Cu]/[Ga]<100, and preferably 2 [Cu]/[Ga]≤50. In the Cu and Ga co-doped p-type MgZnO layer 16 of Example 3, [Cu]/[Ga] is 5.6. The Cu and Ga co-doped p-type MgZnO layer 16 of the semiconductor light emitting element of Example 3 is a p-type ZnO layer having a high Cu concentration which is evenly doped through its thickness.

The production method of Example 3 is capable of producing a Cu and Ga co-doped p-type MgZnO layer 16 which has Cu evenly doped at a high concentration through the thickness of the layer and which has p-type electroconductivity of practical level. This method has also enabled the production by annealing at a low temperature.

Figure 14:
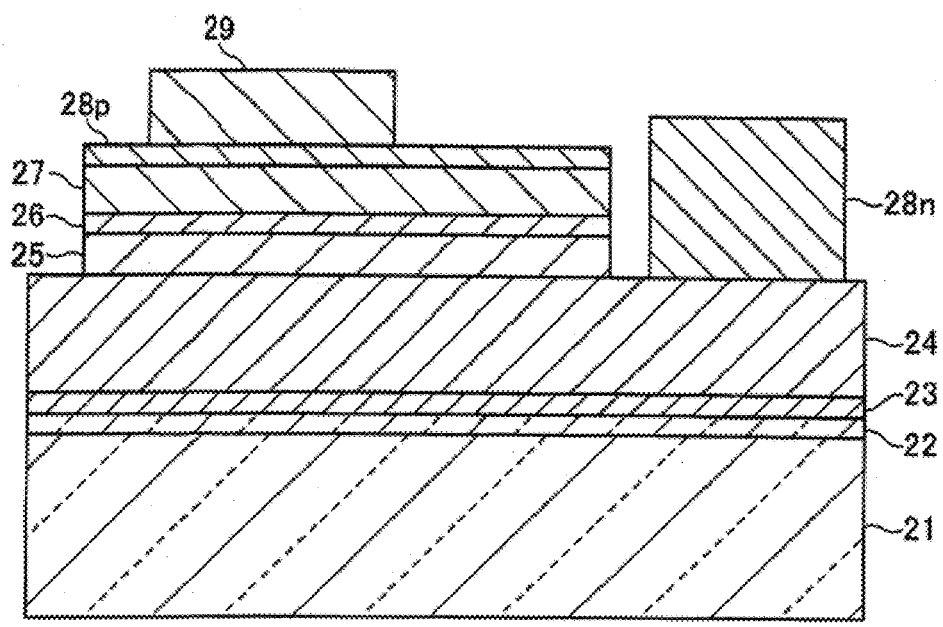
FIG. 14 is a schematic cross sectional view of the ZnO based compound semiconductor light emitting element produced by the production method of Example 4.

FIG. 14 is a schematic cross sectional view of the ZnO based compound semiconductor light emitting element produced by the production method of Example 4. In contrast to Examples 2 and 3 where crystals were allowed to grow on the electroconductive substrate to form the layer, the crystals are allowed to grow on the insulative substrate.

Mg and O are simultaneously supplied onto a c face sapphire substrate 21 which is an insulated substrate to deposit a MgO buffer layer 22 having, a thickness of, for example, 10 nm. In an exemplary embodiment, the MgO buffer layer 22 may be deposited at a temperature of 650° C. with a Mg flux $F_{Mg}$ of 0.05 nm/s by irradiating the O radical beam at an RF power of 300 W and an $O_2$ flow rate of 2.0 sccm. The MgO buffer layer 22 functions as a polarity control layer which facilitates deposition of the overlying ZnO based compound semiconductor layer with the Zn face as its surface.

Zn and O are simultaneously supplied on the MgO buffer layer 22 to deposit a ZnO buffer layer 23 having a thickness of 30 nm, for example, at a temperature of 300° C. and a Zn flux $F_{Zn}$ of 0.15 nm/s by irradiating the O radical beam at an RF power of 300 W and an $O_2$ flow rate of 2.0 sccm. The ZnO buffer layer 23 deposits at the Zn face. Annealing is conducted at 900° C. for 30 minutes to improve crystallinity and surface evenness of the ZnO buffer layer 23.

Zn, O and Ga are simultaneously supplied on the ZnO buffer layer 23 to deposit an n-type ZnO layer 24 having a thickness of, for example, 1.5 μm. In an exemplary embodiment, the n-type ZnO layer 24 is deposited at a temperature of 900° C. and a Zn flux $F_{Zn}$ of 0.05 nm/s by irradiating the O radical beam at an RF power of 300 W and an $O_2$ flow rate of 2.0 sccm, with the Ga cell at a temperature of 480° C.

Zn, Mg, and O are simultaneously supplied on the n-type ZnO layer 24 to deposit an n-type MgZnO layer 25 having a thickness of, for example, 30 nm. The n-type MgZnO layer 25 may be deposited at a temperature of 900° C., a Zn flux $F_{2n}$ of 0.1 nm/s, and a Mg flux $F_{Mg}$ of 0.025 nm/s by irradiating the O radical beam at an RF power of 300 W and an $O_2$ flow rate of 2.0 sccm. Mg composition of the n-type MgZnO layer 25 is, for example, 0.3.

A ZnO active layer 26 having a thickness of, for example, 10 nm is deposited on the n-type MgZnO layer 25. The conditions used for the deposition may be the same as the deposition of the active layer 15 in Example 3. A quantum well structure may be employed instead of the monolayer ZnO layer.

A Cu and Ga co-doped p-type MgZnO layer 27 is formed on the active layer 26. The method used may be, for example, the same as the method used in the formation of the Cu and Ga co-doped p-type MgZnO layer 16 used in Example 3.

The c face sapphire substrate 21 of Example 4 is an insulating substrate, and the n electrode can not be formed on the rear surface of the substrate 21. Accordingly, the Cu and Ga co-doped p-type MgZnO layer 27 is etched from its upper surface until the n-type ZnO layer 24 is exposed to thereby form an n electrode 28n on the thus exposed n-type ZnO layer 24. In the meanwhile, a p electrode 28p is formed on the Cu and Ga co-doped p-type MgZnO layer 27, and a bonding electrode 29 is formed on the p electrode 28p.

The n electrode 28n is formed by depositing a Au layer having a thickness of 500 nm on a Ti layer having a thickness of 10 nm, and the p electrode 28p is formed by depositing a Au layer having a thickness of 10 nm on a Ni layer having a thickness of 0.5 nm. The bonding electrode 29 is formed by a Au layer having a thickness of 500 nm. The ZnO based compound semiconductor light emitting element thus produced by the method of Example 4.

The Cu and Ga co-doped p-type MgZnO layer 27 of the ZnO based compound semiconductor light emitting element of Example 4 is a p-type ZnO based compound semiconductor single crystal layer exhibiting properties similar to those of the Cu and Ga co-doped p-type MgZnO layer 16 of Example 3.

Next, the second experiment of the inventors of the present invention is described. After intensive study, the inventors of the present invention found that the Cu-doped ZnO single crystal film having Ga supplied on the film (the alternate laminate structure) is converted to a p-type film by annealing. The experiment will be described for Sample 6 and Sample 7.

Figure 15A:
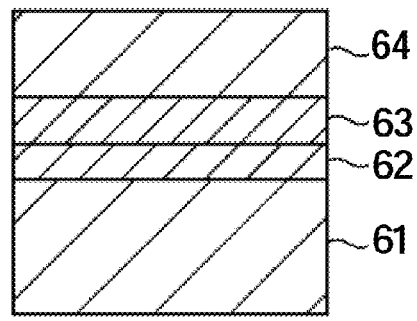
FIG. 15A is a schematic cross sectional view of the specimen before annealing of Sample 6.

FIG. 15A is a schematic cross sectional view of the pre-annealing specimen. The pre-annealing specimen of Sample 6 was prepared by the procedure as described below.

A ZnO buffer layer 62 and an undoped ZnO layer 63 were formed on a ZnO substrate 61 in this order. The method used in the formation of the ZnO buffer layer 62 and the undoped ZnO layer 63 is the same as the method used in the formation of the ZnO buffer layer 52 and the undoped ZnO layer 53 in Sample 1.

Zn, O, and Cu were supplied at a timing different from Ga on the undoped ZnO layer 63 at different timing to form an alternate laminate structure 64. The alternate laminate structure 64 was formed at a temperature of 250° C.

Figure 15B:
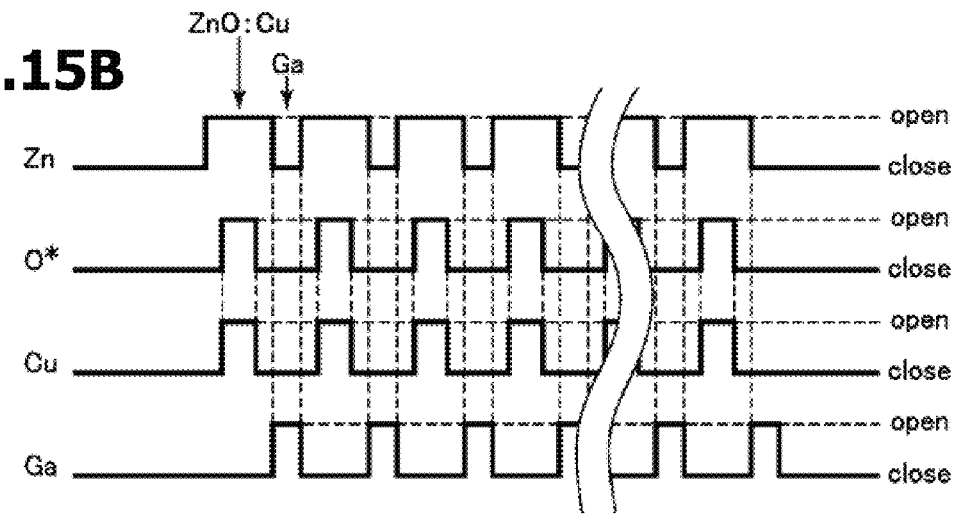
FIG. 15B is a time chart of shutter sequence of Zn cell, O cell, Cu cell, and Ga cell during formation of the alternate laminate structure 64.

FIG. 15B is a time chart showing shutter sequence of the Zn cell, the O cell, the Cu cell, and the Ga cell in forming the alternate laminate structure.

In forming the alternate laminate structure 64, the step of forming the Cu-doped ZnO single crystal film by opening the Zn cell shutter, the O cell shutter, and the Cu cell shutter and closing the Ga cell shutter and the step of Ga attachment (the step of forming the Ga layer) by closing the Zn cell shutter, the O cell shutter, and the Cu cell shutter and opening the Ga cell shutter were alternately repeated.

In the step of forming the Cu-doped ZnO single crystal film, the opening and closing of the O cell shutter and the Cu cell shutter are simultaneously conducted, and the Zn cell shutter is opened before opening the O cell shutter and the Cu cell shutter and closed after closing the O cell shutter and the Cu cell shutter, and in other words, the open period of the Zn cell shutter include the open period of the O cell shutter and the Cu cell shutter.

In the preparation of the pre-annealing specimen of Sample 6, the open period of the O cell shutter and the Cu cell shutter was 8 seconds for each opening, and the open period of the Zn cell shutter was extended 1 second before and after the open period of the O cell shutter and the Cu cell shutter. The open period of the Zn cell shutter was 10 seconds for each opening, and the 8 second period when all of the Zn cell shutter, the O cell shutter, and the Cu cell shutter were open was the period allowed for each Cu-doped ZnO single crystal film growth period. The open period of the Ga cell shutter was 8 seconds for each opening.

Each of the step of forming the Cu-doped ZnO single crystal film and the Ga attachment step were alternately repeated for 60 times to deposit the alternate laminate structure 64 having a thickness of 133 nm. In the formation of the Cu-doped ZnO single crystal film, the Zn flux $F_{Zn}$ was 0.17 nm/s ($J_{Zn}$=1.1×10$^{15}$ atoms/cm$^2$s), and the O radical beam was irradiated at an RF power 300 W and an O$_2$ flow rate 2.0 sccm ($J_O$=8.1×10$^{14}$ atoms/cm$^2$s), and the Cu cell temperature $T_c$, was 990° C. The VI/II flux ratio was 0.74 (Zn rich condition). In the Ga attachment step, the Ga cell temperature $T_{Ga}$ was 540° C.

Figure 15C:
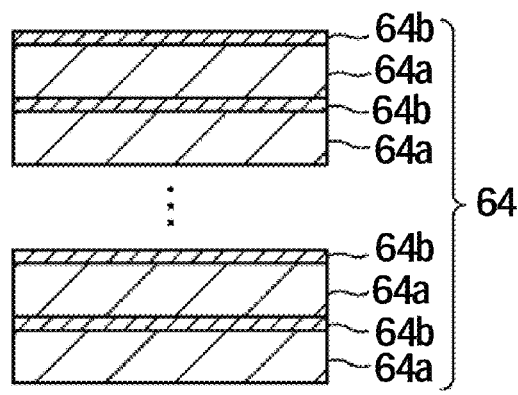
FIG. 15C is a schematic cross sectional view of an alternate laminate structure 64.

FIG. 15C is a schematic cross sectional view of the alternate laminate structure 64. The alternate laminate structure 64 has a structure wherein Cu-doped ZnO single crystal films 64a and Ga layers 64b are alternately laminated one on another. This laminate structure may also be regarded as a laminate structure comprising 60 layers of the Cu-doped ZnO single crystal films 64a each having the Ga supplied thereon disposed one on another in thickness direction.

The Cu-doped ZnO single crystal film 64a has a thickness of approximately 2.2 nm, and the Ga layer 64b has a thickness (Ga attachment thickness) of up to 1 atomic layer, for example, about 1/16 atomic layer. In this case, Ga coverage of the surface of the Cu-doped ZnO single crystal film 64a will be approximately 6%.

Figure 15D:
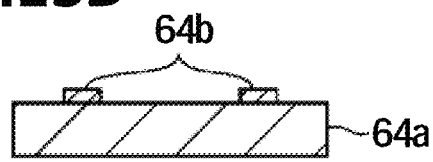
FIG. 15D is a schematic cross sectional view of a Cu-doped ZnO single crystal film 64a and Ga layer 64b.

FIG. 15D is a schematic cross sectional view of the Cu-doped ZnO single crystal film 64a and the Ga layer 64b. For example, the Ga layer 54b having a thickness of about 1/16 atomic layer is formed by Ga attached to a part of the surface of the Cu-doped ZnO single crystal film 64a. For the simplicity of the drawing, the alternate laminate structure is shown by the layer structure of FIG. 15C including such embodiment of the Ga attachment.

FIG. 16A shows graphs of CV profile, depth profile of the impurity concentration, and depth profile of [Cu] and [Ga] measured by SIMS for the alternate laminate structure 64 of the pre-annealing specimen of Sample 6. The upper row is the graph showing the CV profile, the middle row is the graph showing the depth profile of impurity concentration, and the lower row is the graph showing the depth profile of [Cu] and [Ga] measured by SIMS. The x and y axes of the graphs in the upper and middle rows are the same as the graphs in the upper and lower rows of FIG. 3. The x and y axes of the graph in the lower row are the same as the graphs in the lower row of FIG. 5 for Sample 4.

In the graph of the upper row, $1/C^2$ increases with the increase in the voltage, and this means that the Cu-doped ZnO single crystal film 64a having Ga supplied on the surface of the layer (alternate laminate structure 64) has n-type electroconductivity.

The graph in the middle row indicates that the alternate laminate structure 64 has an impurity concentration (donor concentration) $N_d$ of 1.0×10$^{21}$ cm$^{-3}$ to 5.0×10$^{21}$ cm$^{-3}$.

The graph in the lower row indicates that the alternate laminate structure 64 has a Cu concentration [Cu] of 5.02×10$^{20}$ cm$^{-3}$ and a Ga concentration [Ga] of 3.67×10$^{20}$ cm$^{-3}$. The value of [Cu]/[Ga] is 1.37.

Next, Sample 6 was subjected to the annealing in oxygen atmosphere at a flow rate of 1 L/min at 560° C. for 26 minutes.

FIG. 16B shows, from top to down, graphs showing CV profile, depth profile of the impurity concentration, and depth profile of [Cu] and [Ga] measured by SIMS for the position where the alternate laminate structure 64 had been formed of the post-annealing specimen of Sample 6. The x and y axes of the graphs are the same as those of FIG. 16A.

In the graph of the upper row, $1/C^2$ decreases with the increase in the voltage, and this means that the position where alternate laminate structure 64 had been formed has p-type electroconductivity.

The graph in the middle row indicates that the position where alternate laminate structure 64 had been formed (the position where the p-type layer is formed) in the post-annealing specimen of Sample 6 has an impurity concentration (acceptor concentration) $N_a$ of 5.0×10$^{17}$ cm$^{-3}$ to 4.0×10$^{18}$ cm$^{-3}$.

The graph in the lower row indicates that the position where alternate laminate structure 64 had been formed (the position where the p-type layer is formed) has a Cu concentration [Cu] of 4.68×10$^{20}$ cm$^{-3}$, a Ga concentration [Ga] of 4.13×10$^{20}$ cm$^{-3}$, and both [Cu] and [Ga] are approximately constant through the thickness of the p-type layer. Cu and Ga are evenly diffused. The value of [Cu]/[Ga] is 1.13.

Figure 17:
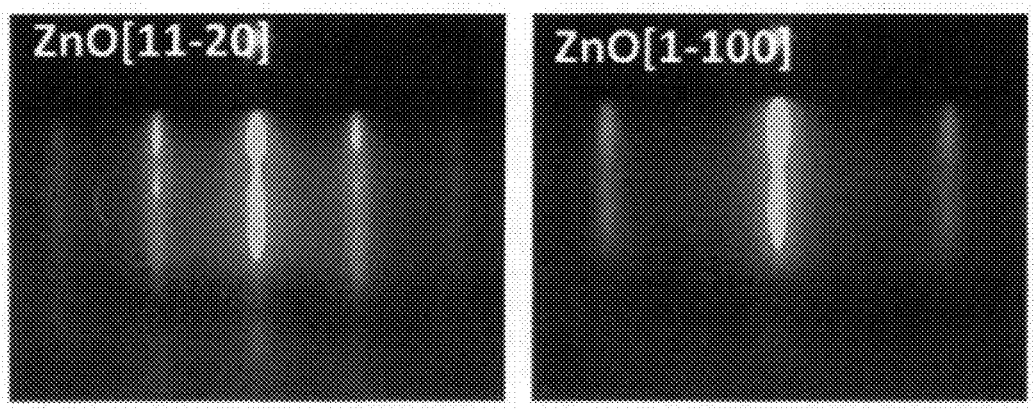
FIG. 17 shows RHEED images of p-type layer from [11-20] direction and [1-100] direction.

FIG. 17 shows RHEED images of p-type layer from the [11-20] direction and the [1-100] direction. The RHEED image shows streak pattern, indicating formation of the single crystal layer with flat surface and good crystallinity.

Use of low temperature (up to 300° C., for example, 250° C.) and Zn rich (Group II rich) conditions in the deposition of the alternate laminate structure 64 has resulted in the suppression of the CuO crystal phase formation, and the alternate deposition of the Cu-doped ZnO film 64a and the Ga layer 64b has promoted migration of Zn on the Ga surface, and hence, growth of the single crystal of the alternate laminate structure 64 (Cu-doped ZnO film 64a).

Next, Sample 7 is described. In the preparation of the pre-annealing specimen of Sample 7, each of the step of depositing the Cu-doped ZnO single crystal film and the Ga attaching step are repeated 60 times to form an alternate laminate structure having a thickness of 100 nm. The Cu-doped ZnO single crystal film was formed under the same conditions as the pre-annealing specimen of Sample 6 except that the VI/II flux ratio was 0.82 (Zn rich condition) by controlling the Zn flux $F_{Zn}$ to 0.15 nm/s ($J_{Zn}$=9.9×10$^{14}$ atoms/cm$^2$s), the Cu cell temperature $T_{Cu}$ was 970° C., and the Ga cell temperature $T_{Ga}$ in the Ga attaching step was 550° C.

FIG. 18A shows, from top to down, graphs showing CV profile, depth profile of the impurity concentration, and depth profile of [Cu] and [Ga] measured by SIMS for the alternate laminate structure of the post-annealing specimen of Sample 7. The x and y axes of the graphs are the same as those of FIG. 16A.

In the graph of the upper row, $1/C^2$ increases with the increase in the voltage, and this means that the Cu-doped ZnO single crystal film having Ga supplied on the film surface (alternate laminate structure) has n-type electroconductivity.

The graph in the middle row indicates that the alternate laminate structure has an impurity concentration (donor concentration) $N_d$ of 1.0×10$^{21}$ cm$^{-3}$ to 3.0×10$^{21}$ cm$^{-3}$.

The graph in the lower row indicates that the alternate laminate structure has a Cu concentration [Cu] of 3.95×10$^{20}$ cm$^{-3}$ and a Ga concentration [Ga] of 4.97×10$^{20}$ cm$^{-3}$. The value of [Cu]/[Ga] value is 0.79.

Sample 7 was subjected to the annealing in oxygen atmosphere at a flow rate of 1 L/min at 630° C. for 10 minutes.

FIG. 18B shows, from top to down, graphs of CV profile, depth profile of the impurity concentration, and depth profile of [Cu] and [Ga] measured by SIMS for the position where the alternate laminate structure had been formed of the post-annealing specimen of Sample 7. The x and y axes of the graphs are the same as those of FIG. 16B.

In the graph of the upper row, $1/C^2$ decreases with the increase in the voltage, and this means that the position where the alternate laminate structure had been formed has p-type electroconductivity.

The graph in the middle row indicates that the position where the alternate laminate structure had been formed (the position where the p-type layer is formed) in the post-annealing specimen of Sample 7 has an impurity concentration (acceptor concentration) $N_a$ of $1.0 \times 10^{18}$ cm$^{-3}$ to $6.5 \times 10^{18}$ cm$^{-3}$.

The graph in the lower row indicates that the position where the alternate laminate structure had been formed (the position where the p-type layer is formed) has a Cu concentration [Cu] of $2.98 \times 10^{20}$ cm$^{-3}$, a Ga concentration [Ga] of $5.41 \times 10^{20}$ cm$^{-3}$, and both [Cu] and [Ga] are approximately constant through the thickness of the p-type layer except for the part near the surface significantly affected by the matters adsorbed on the surface. Cu and Ga are evenly diffused. The value of [Cu]/[Ga] is 0.55.

The results of the Samples 6 and 7 demonstrate that the alternate laminate structure (Cu-doped ZnO single crystal film) of the second experiment is n-type in its as-grown state, and it becomes a p-type structure by the annealing. In the as-grown state, Cu in the Cu-doped ZnO single crystal film is not functioning as an acceptor. Conceivably, the annealing results generation of Cu$^+$ which functions as an acceptor with the even diffusion of the Ga of the Ga layer into the Cu-doped ZnO single crystal film, and the p-type ZnO single crystal layer co-doped with Cu and Ga is thereby formed (conversion to p-type). The alternate laminate structure is converted to p-type after experiencing increase in the resistance.

The annealing conditions (for example, temperature, time, and atmosphere) used for conversion to p-type should be different depending on the thickness of the alternate laminate structure or the Cu-doped ZnO single crystal film, the Cu concentration [Cu], the Ga concentration [Ga], and the [Cu]/[Ga] of the alternate laminate structure, and the like.

In the first experiment, the [Cu]/[Ga] of the alternate laminate structure of the pre-annealing specimen was greater than 1 whereas the [Cu]/[Ga] of the alternate laminate structure of the pre-annealing specimen in the second experiment is 1.37 (Sample 6) and 0.79 (Sample 7). In the production method of the p-type ZnO based compound semiconductor layer of the second experiment 2, a p-type layer is formed even if the [Cu]/[Ga] of the alternate laminate structure of the pre-annealing specimen was up to 1.

In addition, when the inventors of the present invention prepared the samples of the first experiment which has the donor concentration $N_d$ in the alternate laminate structure of pre-annealing specimen and the acceptor concentration $N_a$ at the position corresponding to the alternate laminate structure in the post-annealing specimen substantially equal to Sample 6 for comparison with Sample 6, the samples of the first experiment required an annealing temperature of 600° C., while the conversion to the p-type was realized in Sample 6 at 560° C. This means that the method of the second experiment is capable of forming the p-type layer by annealing at a temperature lower than the method of the first experiment. Accordingly, the method of the second experiment is capable of more effectively reducing the risk of, for example, formation of donor-type point defect such as oxygen vacancy by high temperature annealing, decrease in the Cu concentration and the Ga concentration in the p-type layer associated with diffusion of Cu and Ga to the exterior of the p-type layer, and loss of steepness at the p-n interface associated with the diffusion of the Cu and the Ga to the underlying layer (n-type layer). For example, the method of the second experiment is capable of producing a ZnO based compound semiconductor element having a steeper p-n interface than the Samples of the first experiment.

The results of the second experiment also indicates that, Cu can be evenly doped in the thickness direction at least to a concentration of less than $1.0 \times 10^{21}$ cm$^{-3}$ so that the Cu will be at a concentration high enough, namely, at $1.0 \times 10^{19}$ cm$^{-3}$ or higher, for example, by the method of annealing the Cu-doped n-type ZnO single crystal film having Ga supplied on the film surface. The method of annealing the Cu-doped n-type ZnO single crystal film having Ga supplied on the film surface is capable of producing a p-type layer having an acceptor concentration of at least $1.0 \times 10^{17}$ cm$^{-3}$ and less than $1.0 \times 10^{19}$ cm$^{-3}$. The p-type layer obtained in the second experiment is a p-type ZnO based compound semiconductor single crystal layer having the p-type electroconductivity of practical level.

The method of annealing the Cu-doped ZnO single crystal film having Ga supplied on the film surface is capable of producing a Cu and Ga co-doped ZnO single crystal layer which has Cu evenly doped at a high concentration through the thickness of the layer and which has p-type electroconductivity of practical level. In the Cu and Ga co-doped ZnO single crystal layer, Ga is also evenly doped through the thickness of the layer. The Cu and Ga co-doped ZnO single crystal layer can be produced by conducting the annealing at a lower temperature.

The inventors of the present invention found also for the second experiment that the alternate laminate structure converted into p-type can again be imparted with n-type electroconductivity by further annealing. Accordingly, the annealing may be finished after the process of increase in the resistance and the conversion into p-type and before the returning to the n-type layer.

As described above, the second experiment has demonstrated that a p-type ZnO layer co-doped with Cu and Ga can be produced by alternately repeating the step of depositing the Cu-doped ZnO single crystal film and Ga attachment step to produce the alternate laminate structure, and thereafter annealing the thus prepared alternate laminate structure.

Figure 19A:
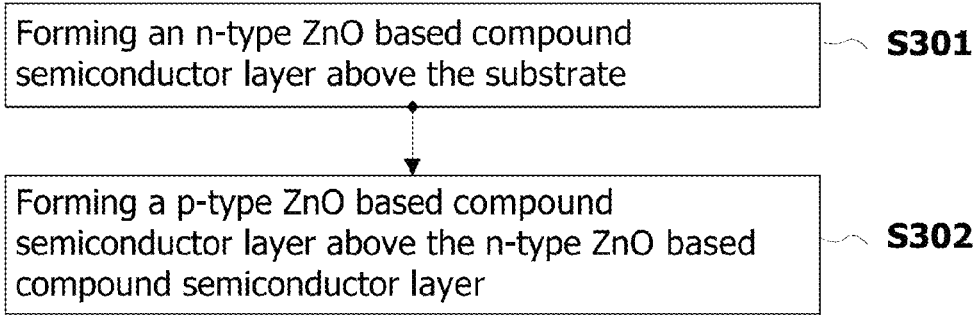
FIGS. 19A and 19B are schematic flow charts of the production method of ZnO based compound semiconductor light emitting element according to Example 5.
Figure 19B:
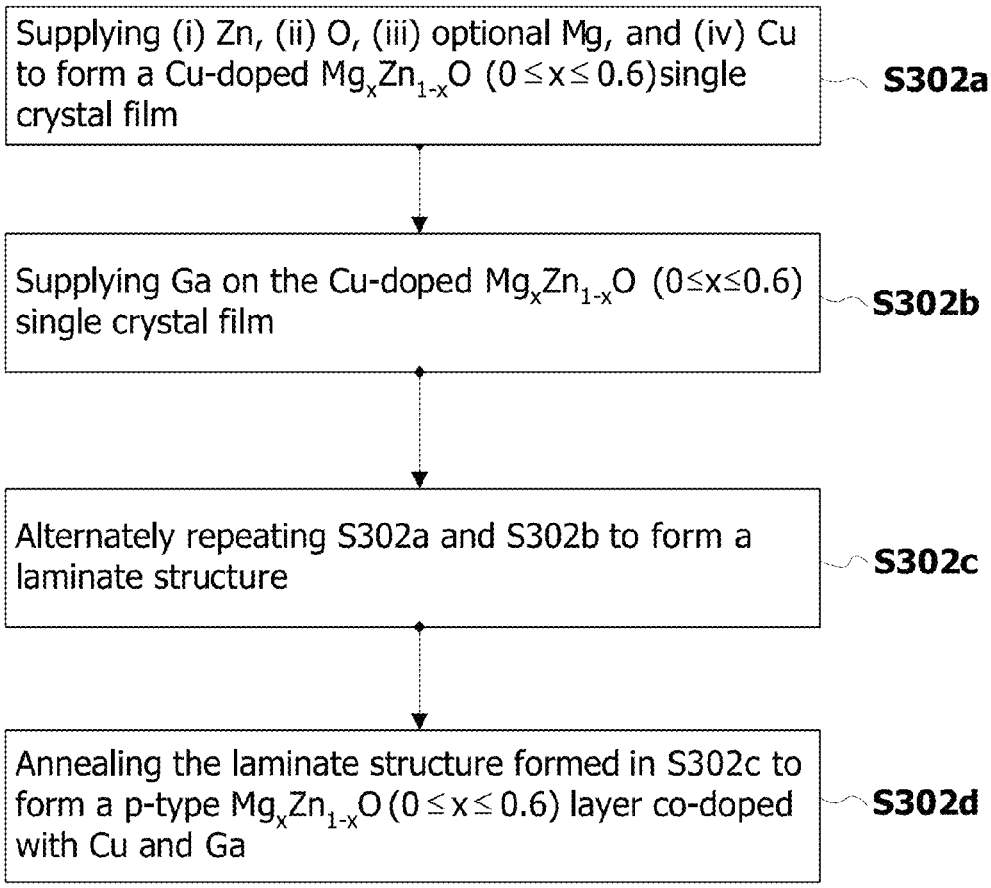

FIGS. 19A and 19B are schematic flow charts of the production method of ZnO based compound semiconductor light emitting element according to Example 5.

As shown in FIG. 19A, the production method of the ZnO based compound semiconductor light emitting element by Example 5 comprises the step of forming an n-type ZnO based compound semiconductor layer above the substrate (step S301) and the step of forming a p-type ZnO based compound semiconductor layer above the n-type ZnO based compound semiconductor layer formed in the step S301 (step S302).

As shown in FIG. 19B, the step S302 of forming the p-type ZnO based compound semiconductor layer comprises four steps of step S302a, step S302b, step S302c, and step S302d.

In the step of forming the p-type ZnO based compound semiconductor layer (step S302), Zn, 0, optional Mg, and Cu are supplied to form the Cu-doped n-type $Mg_xZn_{1-x}O$ ($0 \leq x \leq 0.6$) single crystal film (step S302a). Next, Ga is supplied on the Cu-doped n-type $Mg_xZn_{1-x}O$ ($0 \leq x \leq 0.6$) single crystal film formed in step S302a (step S302b). Step S302a and step S302b are alternately repeated to form the laminate structure (step S302c), and then, the laminate structure formed in step S302c is annealed to form the p-type $Mg_xZn_{1-x}O$ ($0 \leq x \leq 0.6$) layer doped with Cu and Ga (step S302d).

It is to be noted that the n-type ZnO based compound semiconductor laminate structure by Example 5 is prepared by steps S302a to step S302c.

Next, Examples 6 to 8 are described. Examples 6 to 8 are application of Example 5.

Figure 20A:
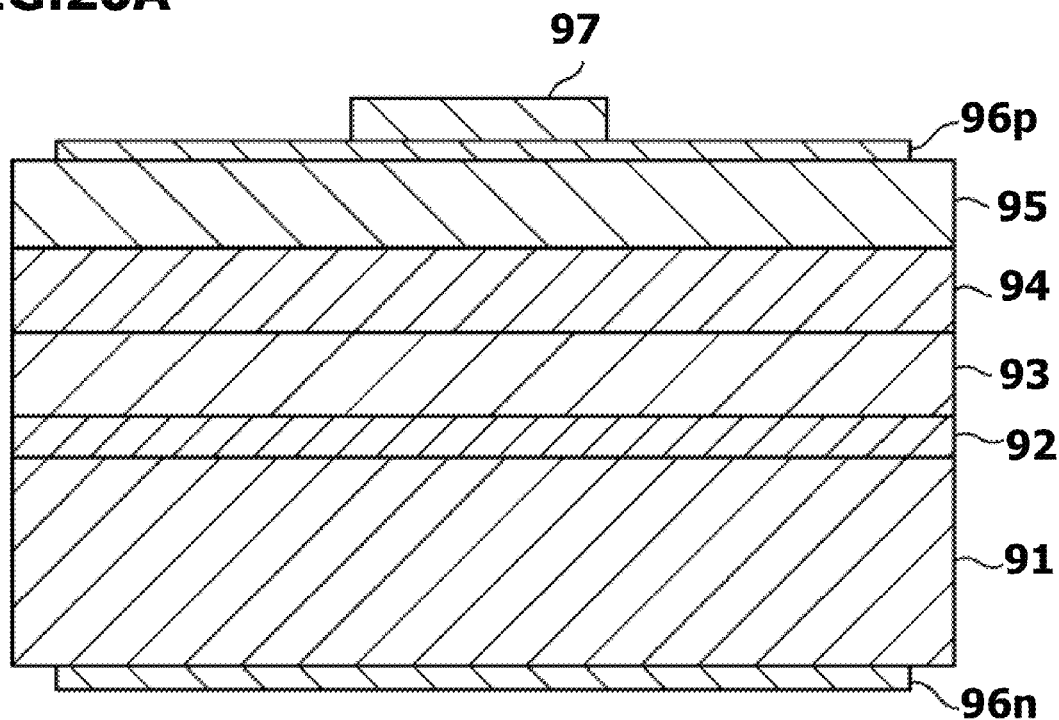
FIG. 20A is a schematic cross sectional view of the ZnO based compound semiconductor light emitting element produced by the production method of Example 6.
Figure 20B:
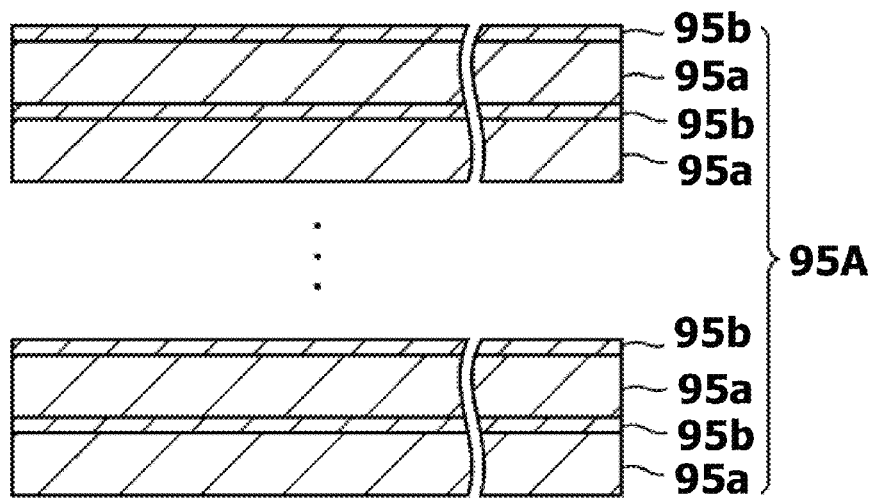
FIG. 20B is a schematic cross sectional view of an alternate laminate structure 95A.

Production of a ZnO based compound semiconductor light emitting element having a homo-structure of Example 6 is described by referring FIGS. 20A and 20B. In FIGS. 20A and 20B, reference number 91 represents a ZnO substrate, 92 represents a ZnO buffer layer, 93 represents an n-type ZnO layer, 94 represents an undoped ZnO active layer, 95 represents a Cu and Ga co-doped p-type ZnO layer, 95A represents an alternate laminate structure, 95a represents a Cu-doped ZnO single crystal film, 95b represents a Ga layer, 96n represents an n electrode, 96p represents a p electrode, and 97 represents a bonding electrode.

FIG. 20A is a schematic cross sectional view of the ZnO based compound semiconductor light emitting element produced by the production method of Example 6.

In Example 6, the ZnO based compound semiconductor light emitting element may be produced by repeating the procedure of Example 2 except for the Cu and Ga co-doped p-type ZnO layer 95.

In the formation of the Cu and Ga co-doped p-type ZnO layer 95, Zn, O, and Cu are supplied at a timing different from Ga at a substrate temperature of 250° C. by using the same shutter sequence (see FIG. 15B) as the preparation of the pre-annealing specimen of Sample 7 to form an alternate laminate structure. More specifically, each of the step of supplying Zn, O, and Cu to deposit the Cu-doped ZnO single crystal film (step S302a in FIG. 19B) and the step of supplying Ga on the Cu-doped ZnO single crystal film (step S302b in FIG. 19B) were alternately repeated 60 times to form an alternate laminate structure having a thickness of 100 nm (step S302c in FIG. 19B). Each growth period of the Cu-doped ZnO single crystal film and each Ga supplying period were 8 seconds. In the deposition of the Cu-doped ZnO single crystal film, the Zn flux $F_{Zn}$ was 0.15 nm/s ($J_{Zn}$=9.9×10$^{14}$ atoms/cm$^2$s), and the O radical beam was irradiated at an RF power of 300 W and an O$_2$ flow rate of 2.0 sccm ($J_O$=8.1×10$^{14}$ atoms/cm$^2$s). The Cu cell temperature $T_{Cu}$ was 970° C., and the VI/II flux ratio was 0.82. In Ga supplying step, the Ga cell temperature $T_{Ga}$ was 550° C.

FIG. 20B is a schematic cross sectional view of an alternate laminate structure 95A. The alternate laminate structure 95A has a structure wherein a Cu-doped ZnO single crystal films 95a and a Ga layers 95b are alternately laminated one on another. The Cu-doped ZnO single crystal film 95a has a thickness of about 1.7 nm, and the Ga layer 95b has a thickness of up to 1 atomic layer, for example, about 1/15 atomic layer (corresponding to about 7% surface coverage by the Ga of the Cu-doped ZnO single crystal film 95a). The alternate laminate structure 95A exhibits n-type electroconductivity, and the donor concentration $N_d$ is, for example, 1.0×10$^{21}$ cm$^{-3}$.

Next, the alternate laminate structure was annealed to form a p-type ZnO single crystal layer co-doped with Cu and Ga (step S302d of FIG. 19B). The alternate laminate structure 95A exhibiting n-type electroconductivity can be converted to a ZnO layer having p-type electroconductivity (Cu and Ga co-doped p-type ZnO layer 95), for example, by annealing in oxygen atmosphere at a flow rate of 1 L/min at 630° C. for 10 minutes.

The Cu and Ga co-doped p-type ZnO layer 95 of the ZnO based compound semiconductor light emitting element produced by the production method of Example 6 is a Cu and Ga co-doped p-type ZnO based compound semiconductor single crystal layer which may be obtained by annealing an alternate laminate structure 95A having a [Cu]/[Ga] of up to 1, for example, 0.79. The Cu concentration [Cu] is at least 1.0×10$^{19}$ cm$^{-3}$ and less than 1.0×10$^{21}$ cm$^{-3}$, for example, 2.98×10$^{20}$ cm$^{-3}$, and this concentration is approximately constant in thickness direction. The Ga concentration [Ga] is, for example, 5.41×10$^{20}$ cm$^{-3}$, and this concentration is approximately constant in thickness direction. In the Cu and Ga co-doped p-type ZnO layer 95 of Example 6, the [Cu]/[Ga] is 0.55.

The production method of Example 6 is capable of producing a Cu and Ga co-doped ZnO single crystal layer 95 which has Cu and Ga evenly doped at a high concentration through the thickness of the layer and which has p-type electroconductivity of practical level. This method has also enabled the production by annealing at a low temperature. The ZnO based compound semiconductor light emitting element produced by the production method of Example 6 has, for example, a steep p-n interface.

A Cu and Ga co-doped p-type ZnO layer was formed in the second experiment and Example 6. A Cu and Ga co-doped $Mg_xZn_{1-x}O$ (0<x≤0.6) single crystal layer exhibiting p-type electroconductivity can be produced by annealing the alternate laminate structure formed by alternately conducing the step of depositing the Cu-doped n-type $Mg_xZn_{1-x}O$ (0<x≤0.6) single crystal film and the Ga attachment step.

Figure 21:
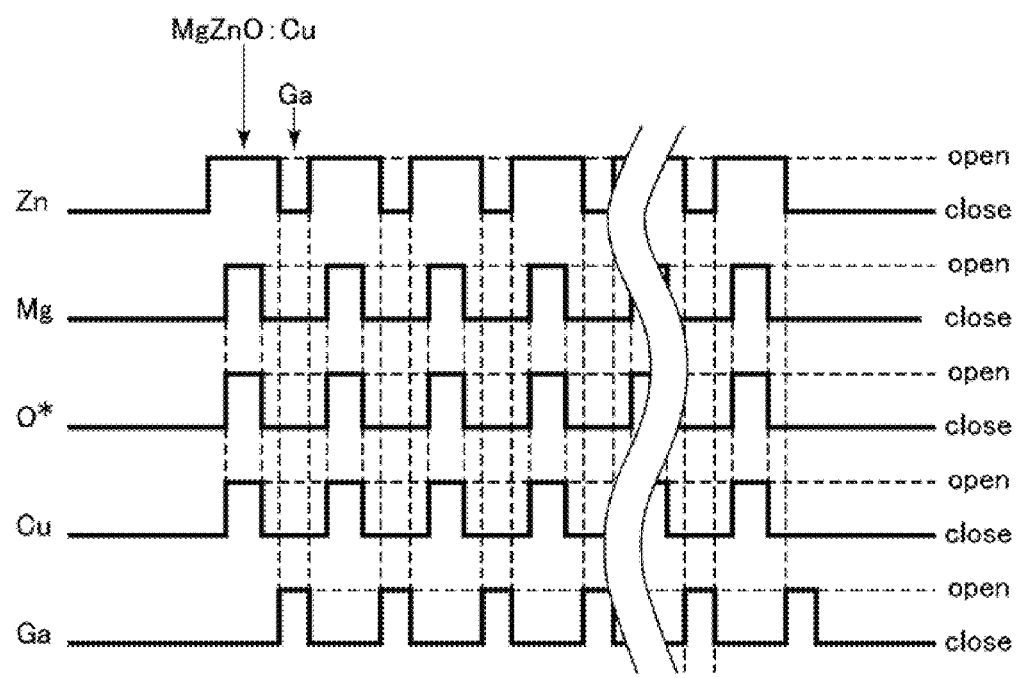
FIG. 21 is a time chart of an exemplary shutter sequence of Zn cell, Mg cell, O cell, Cu cell, and Ga cell during formation of the Cu and Ga co-doped p-type $Mg_xZn_{1-x}O$ (0<x≤0.6) single crystal layer and during formation of the alternate laminate structure.

FIG. 21 is a time chart showing shutter sequence of the Zn cell, the Mg cell, the O cell, the Cu cell, and the Ga cell in forming the alternate laminate structure in the formation of the Cu and Ga co-doped p-type $Mg_xZn_{1-x}O$ (0<x≤0.6) single crystal layer.

In forming the alternate laminate structure, the step of forming the Cu-doped $Mg_xZn_{1-x}O$ (0<x≤0.6) single crystal film by opening the Zn cell shutter, the Mg cell shutter, the O cell shutter, and the Cu cell shutter and closing the Ga cell shutter and the step of Ga attachment by closing the Zn cell shutter, the Mg cell shutter, the O cell shutter, and the Cu cell shutter and opening the Ga cell shutter were alternately repeated.

In the case shown in FIG. 21, the step of forming the Cu-doped $Mg_xZn_{1-x}O$ single crystal film is designed so that the period when Zn cell shutter is open include the period when the Mg cell shutter, the O cell shutter, and the Cu cell shutter are open. More specifically, opening and closing of the Mg cell shutter, the O cell shutter, and the Cu cell shutter are simultaneously conducted while the Zn cell shutter is opened before the opening of the Mg cell shutter, the O cell shutter, and the Cu cell shutter and closed after the closing of the Mg cell shutter, the O cell shutter, and the Cu cell shutter.

For example, each open period of the Mg cell shutter, the O cell shutter, and the Cu cell shutter is 8 seconds. The Zn cell shutter is opened and closed 1 second before and after the open period of the Mg cell shutter, the O cell shutter, and the Cu cell shutter, and therefore, each open period of the Zn cell shutter is 10 seconds. The 8 seconds when all of the Zn cell shutter, the Mg cell shutter, the O cell shutter, and the Cu cell shutter is each growth period of the Cu-doped $Mg_xZn_{1-x}O$ single crystal film. Each open period of the Ga cell shutter is 8 seconds.

Figure 22A:
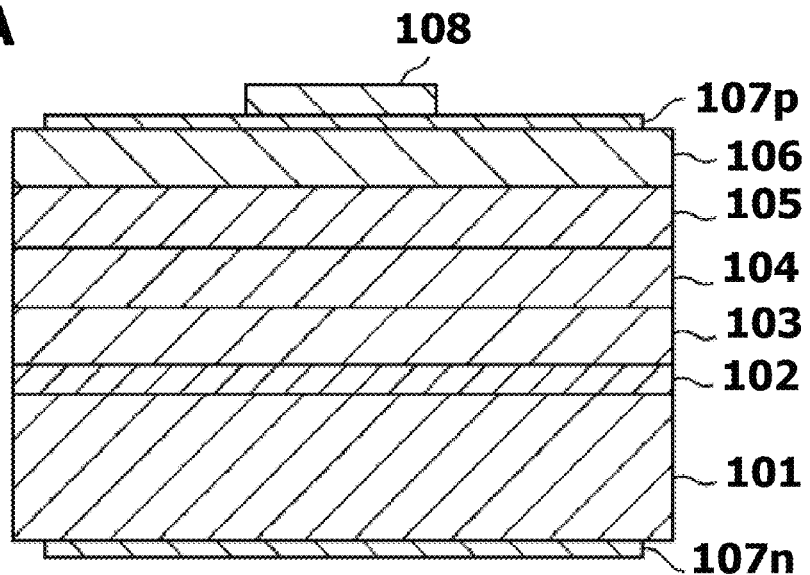
FIG. 22A is a schematic cross sectional view of the ZnO based compound semiconductor light emitting element produced by the production method of Example 7.
Figure 22B:
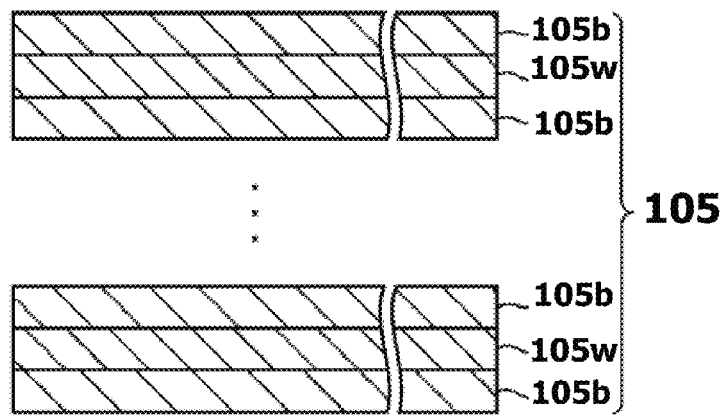
FIG. 22B is a schematic cross sectional view of another embodiment of active layer 105.
Figure 22C:
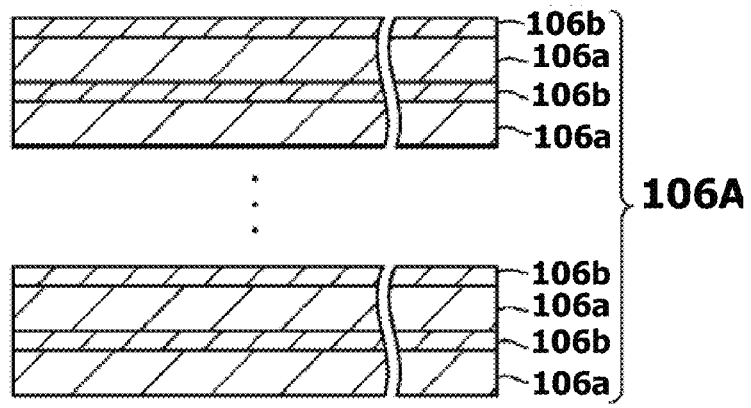
FIG. 22C is a schematic cross sectional view of an alternate laminate structure 106A.
Figure 23:
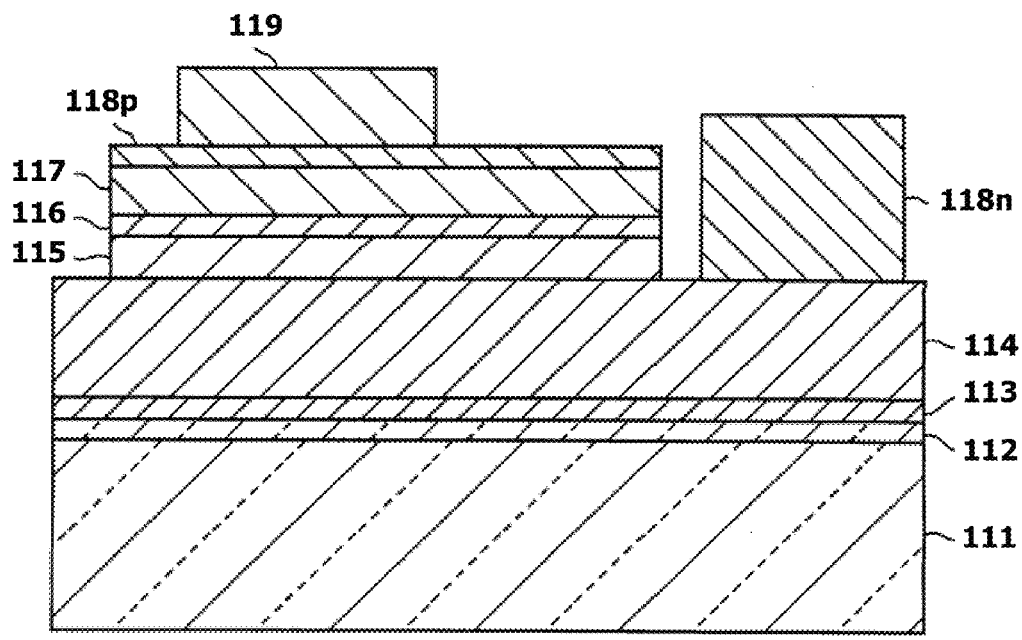
FIG. 23 is a schematic cross sectional view of the ZnO based compound semiconductor light emitting element produced by the production method of Example 8.

Next, Examples 7 and 8 is described by referring to FIGS. 22A to 22C and FIG. 23. In Examples 7 and 8, a ZnO based compound semiconductor light emitting element with a double heterostructure having a Cu and Ga co-doped p-type $Mg_xZn_{1-x}O$ (0<x≤0.6) single crystal layer is produced. FIGS. 22A to 22C corresponds to FIGS. 13A to 13C of Example 3. FIG. 23 corresponds to FIG. 14 of Example 4.

In FIG. 22A to FIG. 22C, and FIG. 23, reference number 101 represents a ZnO substrate, 102 represents a ZnO buffer layer, 103 represents an n-type ZnO layer, 104 represents an n-type MgZnO layer, 105 represents an active layer, 105b represents a MgZnO barrier layer, 105w represents a ZnO well layer, 106 represents a Cu and Ga co-doped p-type MgZnO layer, 106A represents an alternate laminate structure, 106a represents a Cu-doped MgZnO single crystal film, 106b represents a Ga layer, 107n represents an n electrode, 107p represents a p electrode, 108 represents a bonding electrode, 111 represents a c face sapphire substrate, 112 represents a MgO buffer layer, 113 represents a ZnO buffer layer, 114 represents an n-type ZnO layer, 115 represents an n-type MgZnO layer, 116 represents an active layer, 117 represents a Cu and Ga co-doped p-type MgZnO layer, 118n represents an n electrode, 118p represents a p electrode, and 119 represents a bonding electrode.

FIG. 22A is a schematic cross sectional view of the ZnO based compound semiconductor light emitting element produced by the production method of Example 7.

In Example 7, the ZnO based compound semiconductor light emitting element may be produced by repeating the procedure of Example 3 except for the Cu and Ga co-doped p-type MgZnO layer 106.

In forming the Cu and Ga co-doped p-type MgZnO layer 106, the substrate temperature was reduced, for example, to 250° C. and the step of depositing the Cu-doped n-type MgZnO single crystal film and the Ga attachment step were alternately repeated to form an alternate laminate structure on the active layer 105. The shutter sequence of the Zn cell, the Mg cell, the O cell, the Cu the cell, and Ga cell used in forming the alternate laminate structure may be, for example, the same as the one shown in FIG. 21.

For example, each growth period in the Cu-doped MgZnO single crystal film growth step was 8 seconds, and each Ga supplying period in the Ga attachment step was 8 seconds. In the formation of the Cu-doped MgZnO single crystal film, the Zn flux $F_{Zn}$ was 0.15 nm/s and the Mg flux $F_{Mg}$ was 0.04 nm/s, and the O radical beam was irradiated at an RF power of 300 W and an $O_2$ flow rate of 2.0 sccm, and the Cu cell temperature $T_{Cu}$, was 990° C. The VI/II flux ratio was 0.70. In the Ga supplying step, the Ga cell temperature $T_{Ga}$ was 540° C. Each of the step of forming the Cu-doped MgZnO single crystal film and the Ga attachment step were alternately repeated for 60 times to deposit the alternate laminate structure having a thickness of 120 nm.

As in the case of Example 3, the active layer 105 may comprise a quantum well structure formed by alternately depositing a MgZnO barrier layer 105b and a ZnO well layer 105w one on another instead of the single layer ZnO layer as shown in FIG. 22B.

FIG. 22C is a schematic cross sectional view of an alternate laminate structure 106A. The alternate laminate structure 106A has a structure wherein a Cu-doped MgZnO single crystal film 106a and a Ga layer 106b are alternately laminated one on another. The Cu-doped MgZnO single crystal film 106a has a thickness of approximately 2.0 nm, the Ga layer 106b has a thickness of up to 1 atomic layer, for example, about 1/16 atomic layer (corresponding to Ga surface coverage of the Cu-doped MgZnO single crystal film 106a of approximately 6%). The alternate laminate structure 106A exhibits n-type electroconductivity, and the donor concentration $N_d$ is, for example, $1.5 \times 10^{20}$ cm$^{-3}$.

Next, the alternate laminate structure 106A was annealed to form a Cu and Ga co-doped p-type MgZnO layer 106 on the active layer 105. The alternate laminate structure 106A exhibiting n-type electroconductivity can be converted to a single crystal layer exhibiting p-type electroconductivity (a Cu and Ga co-doped p-type MgZnO layer 106) by conducting the annealing in an oxygen atmosphere at a flow rate of 1 L/min at 610° C. for 10 minutes. The Mg composition in the Cu and Ga co-doped p-type MgZnO layer 106 is, for example, 0.3.

The Cu and Ga co-doped p-type MgZnO layer 106 of the ZnO based compound semiconductor light emitting element produced in Example 7 is a Cu and Ga co-doped p-type ZnO based compound semiconductor single crystal layer which may be obtained by annealing an alternate laminate structure 106A having a [Cu]/[Ga] of at least 0.5, for example, 1.40. The Cu concentration [Cu] is at least $1.0 \times 10^{15}$ cm$^{-3}$ and less than $1.0 \times 10^{21}$ cm$^{-3}$, for example, $5.0 \times 10^{20}$ cm$^{-3}$, and this concentration is approximately constant in thickness direction. The Ga concentration [Ga] is, for example, $4.0 \times 10^{20}$ cm$^{-3}$, and this concentration is approximately constant in thickness direction. In the Cu and Ga co-doped p-type MgZnO layer 106 of Example 7, the [Cu]/[Ga] is 1.25.

The production method of Example 7 is capable of producing a Cu and Ga co-doped MgZnO single crystal layer 106 which has Cu and Ga evenly doped at a high concentration through the thickness of the layer and which has p-type electroconductivity of practical level. This method has also enabled the production by annealing at a low temperature. The ZnO based compound semiconductor light emitting element produced by the production method of Example 7 has, for example, a steep p-n interface.

FIG. 23 is a schematic cross sectional view of the ZnO based compound semiconductor light emitting element produced by the production method of Example 8.

In Example 8, the ZnO based compound semiconductor light emitting element may be produced by repeating the procedure of Example 4 except for the Cu and Ga co-doped p-type MgZnO layer 117.

The Cu and Ga co-doped p-type MgZnO layer 117 may be formed, for example, by the same procedure as the formation of the Cu and Ga co-doped p-type MgZnO layer 106 in Example 7.

The Cu and Ga co-doped p-type MgZnO layer 117 of the ZnO based compound semiconductor light emitting element of Example 8 is a p-type ZnO based compound semiconductor single crystal layer which has similar properties as the Cu and Ga co-doped p-type MgZnO layer 106 of Example 7.

The present invention has been described by referring to Experiments and Examples. The present invention, however, is not limited by these Experiments and Examples.

For example, O radical was used for the source of oxygen in the production method of the Examples. The oxygen source used may also be ozone, a polar oxidizing agent such as $H_2O$ or alcohol, or other highly oxidative gas.

In the production method of the Examples, the Ga-doped n-type $Mg_xZn_{1-x}O$ ($0 \leq x \leq 0.6$) single crystal film having Cu supplied on the film surface and the Cu-doped n-type $Mg_xZn_{1-x}O$ ($0 \leq x \leq 0.6$) single crystal film having Ga supplied on the film surface were formed by MBE. However, the method used in forming such layer is not limited the MBE, and the layer may be formed, for example, by vacuum deposition or sputtering.

In addition, in the first experiment and Examples 1 to 4, the Ga-doped n-type $Mg_xZn_{1-x}O$ ($0 \leq x \leq 0.6$) single crystal film having Cu supplied on the film surface was annealed to form the Cu-doped p-type film (Cu and Ga co-doped p-type $Mg_xZn_{1-x}O$ ($0 \leq x \leq 0.6$) single crystal film). When the Ga (a Group 13 element)-doped n-type $Mg_xZn_{1-x}O$ single crystal film having the Cu (Group 11 element) attached is annealed, binding of the Cu in its monovalent state ($Cu^+$) with O which is a Group 16 element is facilitated, and this results in the higher tendency of the generation of the monovalent $Cu^+$ which functions as an acceptor compared to the divalent $Cu^{2+}$, and hence, conversion of the Ga-doped n-type $Mg_xZn_{1-x}O$ single crystal film to the p-type. Accordingly, Ag which is a Group 11 element which may have different valances as in the case of Cu may be used instead of Cu or simultaneously with the Cu. Similarly, a Group 13 element such as B, Al, or In can be used for the Ga, and the Group 13 element used may be a Group 13 element selected from the group consisting of B, Ga, Al, and In.

For the same reason, Ag which is a Group 11 element which may have different valances as in the case of Cu may be used instead of Cu or simultaneously with the Cu in the second experiment and Examples 5 to 8. Similarly, a Group 13 element such as B, Al, or In can be used for the Ga, and the Group 13 element used may be a Group 13 element selected from the group consisting of B, Ga, Al, and In.

It is to be noted that in the Cu and Ga co-doped p-type $Mg_xZn_{1-x}O$ (0≤x≤0.6) single crystal film, Cu in its monovalent state and Ga in its trivalent state substitute the Zn or the Mg site, and the Cu and the Ga electrically attracts each other. Because of such mutual electrical attraction between the Cu and the Ga, Cu in its monovalent state functioning as an acceptor has higher tendency of substituting the Zn or the Mg site compared to Cu in the divalent state.

In other words, the p-type $Mg_xZn_{1-x}O$ (0≤x≤0.6) single crystal film (p-type $Mg_xZn_{1-x}O$ (0≤x≤0.6) single crystal film co-doped with the Group 11 element and the Group 13 element) wherein the Zn or Mg site is substituted by Group 11 element which is Cu and/or Ag in its monovalent state or at least one Group 13 element selected from the group consisting of B, Ga, Al, and In in its trivalent state, and the Group 11 element and the Group 13 element are electrically attracting each other is produced by the method of annealing $Mg_xZn_{1-x}O$ (0≤x≤0.6) single crystal film doped with at least one Group 13 element selected from the group consisting of B, Ga, Al, and In having Cu and/or Ag supplied on the film surface and the method of annealing $Mg_xZn_{1-x}O$ (0≤x≤0.6) single crystal film doped with Cu and/or Ag having at least one Group 13 element selected from the group consisting of B, Ga, Al, and In supplied on the film surface.

As readily understood by those skilled in the art, various modifications, improvements, combinations, and the like are possible for the present invention.

It is to be noted that the findings (1) to (3) as described below have been obtained in the related application of the inventors of the present invention (Japanese Patent Application No. 2012-41096) wherein the Cu-doped p-type $Mg_xZn_{1-x}O$ (0≤x≤0.6) layer is produced by the steps of (a) forming $Mg_xZn_{1-x}O$ (0≤x≤0.6) single crystal film and (13) supplying Cu on the $Mg_xZn_{1-x}O$ (0≤x≤0.6) single crystal film.

(1) Thickness of the $Mg_xZn_{1-x}O$ (0≤x≤0.6) single crystal film formed in each step (α) is preferably up to 10 nm for avoiding unfavorable crystallinity.

(2) In the step (α), the $Mg_xZn_{1-x}O$ (0≤x≤0.6) single crystal film is preferably formed in stoichiometric conditions (wherein VI/II flux ratio is 1) or Group II rich conditions (wherein VI/II flux ratio is less than 1) for realizing high evenness and good crystallinity, and more preferably, under the condition that the VI/II flux ratio is at least 0.5 and less than 1.

(3) In the step (a), the $Mg_xZn_{1-x}O$ (0≤x≤0.6) single crystal film is preferably formed at a temperature (substrate temperature) of at least about 200° C. and up to 350° C. in view of realizing good crystal growth.

In the step of preparing the Ga-doped n-type $Mg_xZn_{1-x}O$ (0≤x≤0.6) single crystal film having Cu supplied on the film surface and the step of preparing the Cu-doped n-type $Mg_xZn_{1-x}O$ (0≤x≤0.6) single crystal film having Ga supplied on the film surface in the present invention, a p-type $Mg_xZn_{1-x}O$ (0≤x≤0.6) layer having high evenness and good crystallinity can be realized when the Ga-doped n-type $Mg_xZn_{1-x}O$ single crystal film and the Cu-doped n-type $Mg_xZn_{1-x}O$ single crystal film are deposited under the conditions (1) to (3) as described above.

FIG. 24 is a table summarizing conditions used in forming the Ga-doped n-type $Mg_xZn_{1-x}O$ single crystal film in Examples 2 to 4.

As shown in this table, the conditions of (1) to (3) are satisfied in all of Examples 2 to 4. Accordingly, the p-type $Mg_xZn_{1-x}O$ (0≤x≤0.6) layer produced by the production method of Examples 2 to 4 has high evenness as well as good crystallinity.

FIG. 25 is a table summarizing conditions used in forming the Cu-doped n-type $Mg_xZn_{1-x}O$ single crystal film in Examples 6 to 8.

As shown in this table, the conditions of (1) to (3) are satisfied in all of Examples 6 to 8. Accordingly, the p-type $Mg_xZn_{1-x}O$ (0≤x≤0.6) layer produced by the production method of Examples 6 to 8 has high evenness as well as good crystallinity.

The inventors of the present invention examined the surface by using images taken by an atomic force microscope (AFM). The examination confirmed that the surface of the p-type $Mg_xZn_{1-x}O$ (0≤x≤0.6) layer has a surface evenness higher than the surface of the alternate laminate structure. Annealing results a p-type ZnO based compound semiconductor layer having an improved evenness.

The p-type ZnO based compound semiconductor layer produced by the method of Examples may be used, for example, in a light emitting diode (LED) or a laser diode (LD) emitting a light having a short wavelength (the wavelength range of ultraviolet to blue), various products produced by such LED or LD (for example, indicators, LED displays, and light source for CV/DVD), and also, in white LED and various products produced using such while LED (for example, light fixtures, indicators, displays, and backlight of various displays), and ultraviolet sensor.

What we claim are:

1. A method for producing a p-type ZnO based compound semiconductor layer comprising the steps of
    (a) supplying (i) Zn, (ii) O, (iii) optionally Mg, and (iv) a Group 11 element which is Cu and/or Ag to form a $Mg_xZn_{1-x}O$ single crystal film doped with the Group 11 element, wherein 0≤x≤0.6;
    (b) supplying at least one Group 13 element selected from the group consisting of B, Ga and Al on the $Mg_xZn_{1-x}O$ single crystal film, wherein 0≤x≤0.6,
    wherein supplying Zn is carried out in an open period of a Zn cell shutter, supplying O is carried out in an open period of an O cell shutter, supplying at least one of B, Ga or Al is carried out in an open period of at least one of a B, Ga or Al cell shutter and supplying Cu and/or Ag is carried out in an open period of a Cu and/or Ag cell shutter, and
    wherein the open period of the Zn cell shutter includes the open period of the O cell shutter and the open period of the Cu and/or Ag cell shutter, and does not include the open period of the at least one of the B, Ga or Al cell shutter; and the open period of the O cell shutter or the open period of the Cu and/or Ag cell shutter does not coincide with a beginning of the open period of the Zn cell shutter and an ending of the open period of the Zn cell shutter;
    (c) alternately carrying out the steps (a) and (b) to form a laminate structure; and
    (d) annealing the laminate structure to form a p-type $Mg_xZn_{1-x}O$ layer co-doped with the Group 11 element, and the Group 13 element, wherein 0≤x≤0.6.

2. The method for producing a p-type ZnO based compound semiconductor layer according to claim 1, wherein the step (a) is carried out by molecular beam epitaxy (MBE) at a substrate temperature of up to 350° C.

3. The method for producing a p-type ZnO based compound semiconductor layer according to claim 1, wherein the step (a) is carried out under a condition that a VI/II flux ratio is at least 0.5 and less than 1, wherein the condition wherein the VI/II flux ratio is less than 1 is referred to as a Group II rich condition, the condition wherein the VI/II flux ratio is equal to 1 is referred to as a stoichiometric condition, and the condition wherein the VI/II flux ratio is greater than 1 is referred to as a Group VI rich condition.

4. A method for producing a ZnO based compound semiconductor element comprising the steps of forming an n-type ZnO based compound semiconductor layer above a substrate; and forming a p-type ZnO based compound semiconductor layer above the n-type ZnO based compound semiconductor layer;

wherein the step of forming the p-type ZnO based compound semiconductor layer comprises the steps of (a) supplying (i) Zn, (ii) O, (iii) optionally Mg, and (iv) a Group 11 element which is Cu and/or Ag to form a $Mg_xZn_{1-x}O$ single crystal film doped with the Group 11 element, wherein $0 \leq x \leq 0.6$;

(b) supplying at least one Group 13 element selected from the group consisting of B, Ga and Al on the $Mg_xZn_{1-x}O$ single crystal film, wherein $0 \leq x \leq 0.6$, wherein supplying Zn is carried out in an open period of a Zn cell shutter, supplying O is carried out in an open period of an O cell shutter, supplying at least one of B, Ga or Al is carried out in an open period of at least one of a B, Ga or Al cell shutter and supplying Cu and/or Ag is carried out in an open period of a Cu and/or Ag cell shutter, and wherein the open period of the Zn cell shutter includes the open period of the O cell shutter and the open period of the Cu and/or Ag cell shutter, and does not include the open period of the at least one of the B, Ga or Al cell shutter; and the open period of the O cell shutter or the open period of the Cu and/or Ag cell shutter does not coincide with a beginning of the open period of the Zn cell shutter and the end an ending of the open period of the Zn cell shutter;

(c) alternately carrying out the steps (a) and (b) to form a laminate structure; and (d) annealing the laminate structure to form a p-type $Mg_xZn_{1-x}O$ layer co-doped with the Group 11 element, and the Group 13 element, wherein $0 \leq x \leq 0.6$.

5. The method for producing a ZnO based compound semiconductor element according to claim 4, wherein the step (a) is conducted by molecular beam epitaxy (MBE) at a substrate temperature of up to 350° C.

6. The method for producing a ZnO based compound semiconductor element according to claim 4, wherein the step (a) is carried out under a condition that a VI/II flux ratio is at least 0.5 less than 1, wherein the condition wherein the VI/II flux ratio is less than 1 is referred to as a Group II rich condition, the condition wherein the VI/II flux ratio is equal to 1 is referred to as a stoichiometric condition, and the condition wherein the VI/II flux ratio is greater than 1 is referred to as a Group VI rich condition.

* * * * *